(12) United States Patent
Ha

(10) Patent No.: US 10,964,399 B2
(45) Date of Patent: Mar. 30, 2021

(54) ONE-TIME PROGRAMMABLE (OTP) MEMORY DEVICES AND METHODS OF TESTING OTP MEMORY DEVICES

(71) Applicant: SAMSUNG ELECTRONICS CO., LTD., Suwon-si (KR)

(72) Inventor: Min-Yeol Ha, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/524,316

(22) Filed: Jul. 29, 2019

(65) Prior Publication Data

US 2020/0219570 A1 Jul. 9, 2020

(30) Foreign Application Priority Data

Jan. 3, 2019 (KR) .......................... 10-2019-0000608

(51) Int. Cl.

| G11C 29/24 | (2006.01) |
|---|---|
| G11C 16/26 | (2006.01) |
| G11C 16/08 | (2006.01) |
| G11C 16/24 | (2006.01) |
| G11C 29/02 | (2006.01) |
| G11C 16/12 | (2006.01) |

(52) U.S. Cl.
CPC .............. *G11C 16/26* (2013.01); *G11C 16/08* (2013.01); *G11C 16/12* (2013.01); *G11C 16/24* (2013.01); *G11C 29/024* (2013.01); *G11C 29/24* (2013.01)

(58) Field of Classification Search
CPC ......... G11C 16/26; G11C 16/08; G11C 29/24; G11C 16/24; G11C 29/024; G11C 16/12; G11C 17/18; G11C 17/16; G11C 2029/1202
See application file for complete search history.

(56) References Cited

U.S. PATENT DOCUMENTS

| 5,214,604 A | * | 5/1993 | Kato ..................... G11C 29/02 365/185.2 |
| 5,526,307 A | * | 6/1996 | Yiu ........................ G08G 1/017 257/316 |
| 6,608,498 B2 | | 8/2003 | Khoury |

(Continued)

FOREIGN PATENT DOCUMENTS

KR 10-1378625 3/2014

*Primary Examiner* — Khamdan N. Airobaie
(74) *Attorney, Agent, or Firm* — F. Chau & Associates, LLC

(57) ABSTRACT

A one-time programmable (OTP) memory device including: a cell array circuit including an OTP cell array and dummy cell block, the OTP cell array includes OTP memory cells coupled to bit-lines, read word-lines and voltage word-lines and the dummy cell block is coupled to the read word-lines and voltage word-lines; a row decoder coupled to the dummy cell block and the OTP cell array through the read word-lines and voltage word-lines; a column decoder coupled to the OTP cell array through the bit-lines; a write-sensing circuit coupled to the column decoder; and a control circuit to control the cell array circuit, row decoder and write-sensing circuit based on a command and address, the cell array circuit further includes an isolation circuit to cut off first and second voltages which are transferred to the OTP cell array from the row decoder, in response to control codes in a test mode.

19 Claims, 20 Drawing Sheets

(56) References Cited

U.S. PATENT DOCUMENTS

| | | | |
|---|---|---|---|
| 7,206,214 B2 | 4/2007 | Hoefler et al. | |
| 7,457,152 B2 * | 11/2008 | Lee | G11C 11/5678 |
| | | | 365/163 |
| 7,843,747 B2 | 11/2010 | Hsueh et al. | |
| 8,056,479 B2 | 11/2011 | Kurjanowicz | |
| 8,122,307 B1 | 2/2012 | Lindhorst et al. | |
| 8,125,837 B2 * | 2/2012 | Yamaoka | G11C 11/412 |
| | | | 365/189.07 |
| 8,526,254 B2 | 9/2013 | Kurjanowicz | |
| 8,848,468 B2 * | 9/2014 | Kitagawa | H03L 7/0812 |
| | | | 365/191 |
| 8,917,533 B2 * | 12/2014 | Chung | G11C 29/10 |
| | | | 365/96 |
| 9,524,795 B2 * | 12/2016 | Lee | G11C 17/18 |
| 9,911,467 B2 * | 3/2018 | Cheon | G11C 7/1045 |
| 2003/0128598 A1 * | 7/2003 | Lim | G11C 7/04 |
| | | | 365/194 |
| 2005/0088881 A1 * | 4/2005 | Miki | G11C 11/4074 |
| | | | 365/189.09 |
| 2005/0157576 A1 * | 7/2005 | Sato | G11C 7/02 |
| | | | 365/222 |
| 2006/0139995 A1 | 6/2006 | Keshavarzi et al. | |
| 2008/0298124 A1 * | 12/2008 | Wong | G11C 11/5628 |
| | | | 365/185.03 |
| 2008/0316825 A1 * | 12/2008 | Hwang | G11C 7/227 |
| | | | 365/185.11 |
| 2009/0086531 A1 * | 4/2009 | Yang | G11C 29/06 |
| | | | 365/158 |
| 2009/0180317 A1 * | 7/2009 | Kang | G11C 11/5628 |
| | | | 365/185.2 |
| 2010/0012997 A1 * | 1/2010 | Jang | H01L 27/11551 |
| | | | 257/315 |
| 2011/0216603 A1 * | 9/2011 | Han | H01L 27/11582 |
| | | | 365/185.23 |
| 2013/0077377 A1 * | 3/2013 | Kim | G11C 17/08 |
| | | | 365/104 |
| 2018/0096987 A1 * | 4/2018 | Bill | H01L 22/34 |

* cited by examiner

ONE-TIME PROGRAMMABLE (OTP) MEMORY DEVICES AND METHODS OF TESTING OTP MEMORY DEVICES

CROSS-REFERENCE TO RELATED APPLICATION

This application claims priority under 35 U.S.C. § 119 to Korean Patent Application No. 10-2019-0000608, filed on Jan. 3, 2019 in the Korean Intellectual Property Office (KIPO), the disclosure of which is incorporated by reference herein in its entirety.

TECHNICAL FIELD

Exemplary embodiments of the inventive concept relate to a one-time programmable (OTP) memory device and a method of testing the OTP memory device.

DISCUSSION OF RELATED ART

In a one-time programmable (OTP) memory device, data may be stored using a plurality of OTP cells. For example, each of the OTP cells may have an un-programmed state and a programmed state. Data programmed in an OTP cell can be retained in the absence of power. In this case, the OTP cell may function like a nonvolatile memory. An OTP cell that has been programmed a first time cannot be re-programmed a second time. In other words, a programmed OTP cell is irreversible in state. In some examples, an OTP cell may include a fuse or an anti-fuse and may be electrically programmed. OTP memories are used in the field of electronics for the permanent storage of information in various applications.

Compared to the testing of memories that can be re-programmed multiple times, it is less efficient to test an OTP memory. This is due to the fact that the cells of the OTP memory cannot be re-programmed.

SUMMARY

According to an exemplary embodiment of the inventive concept, a one-time programmable (OTP) memory device includes: a cell array circuit including an OTP cell array and a dummy cell block, wherein the OTP cell array includes a plurality of OTP memory cells coupled to a plurality of bit-lines, a plurality of read word-lines and a plurality of voltage word-lines and the dummy cell block is coupled to the plurality of read word-lines and the plurality of voltage word-lines; a row decoder coupled to the dummy cell block and the OTP cell array through the plurality of read word-lines and the plurality of voltage word-lines; a column decoder coupled to the OTP cell array through the plurality of bit-lines; a write-sensing circuit coupled to the column decoder; and a control circuit configured to control the cell array circuit, the row decoder and the write-sensing circuit based on a command and an address, wherein the cell array circuit further includes an isolation circuit configured to cut off a first voltage and a second voltage which are transferred to the OTP cell array from the row decoder, in response to control codes in a first test mode.

According to an exemplary embodiment of the inventive concept, there is provided a method of testing an OTP memory device that includes an OTP cell array including a plurality of OTP memory cells coupled to a plurality of bit-lines, a plurality of read word-lines and a plurality of voltage word-lines, a dummy cell block coupled to the plurality of read word-lines and the plurality of voltage word-lines and an isolation circuit coupled to the OTP cell array and the dummy cell block. In the method, a connection of the dummy cell block and the OTP cell array is cut-off by the isolation circuit in a first test mode, a pair of a read word-line and a voltage word-line is selected of the read word-lines and the voltage word-lines, a first test bit-line signal and a second test bit-line signal are generated in response to a first test enable signal by a test bit-line signal generator coupled to the dummy cell block, and it is determined whether a row decoder and a column decoder are defective based on comparison of a test result pattern output through the bit-lines and an expected pattern. The row decoder is coupled to the plurality of read word-lines and the plurality of voltage word-lines and the column decoder is coupled to the plurality of bit-lines.

According to an exemplary embodiment of the inventive concept, there is provided a method of testing an OTP memory device that includes an OTP cell array including a plurality of OTP memory cells coupled to a plurality of bit-lines, a plurality of read word-lines and a plurality of voltage word-lines, a dummy cell block coupled to the plurality of read word-lines and the plurality of voltage word-lines and an isolation circuit coupled to the OTP cell array and the dummy cell block. In the method, a first test is performed on a row decoder coupled to the plurality of read word-lines and the plurality of voltage word-lines and a column decoder coupled to the plurality of bit-lines after cutting-off, by the isolation circuit, a connection of the dummy cell block and the OTP cell array in a first test mode, a second test is performed on the OTP cell array in a second test mode if the row decoder and the column decoder are determined not to be defective in the first test and it is determined whether the OTP memory device is defective based on a result of the second test.

According to an exemplary embodiment of the inventive concept, an OTP memory device includes: a cell array circuit including an OTP cell array, an isolation circuit and a dummy cell block, wherein the OTP cell array includes a plurality of OTP memory cells coupled to a plurality of bit-lines, a plurality of first word-lines and a plurality of second word-lines; a row decoder coupled to the dummy cell block through the plurality of first word-lines and the plurality of second word-lines; a column decoder coupled to the OTP cell array through the plurality of bit-lines; and a control circuit configured to control the cell array circuit and the row decoder, wherein the row decoder is configured to provide the isolation circuit with control codes instructing the isolation circuit to cut off a first voltage and a second voltage in a test mode.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
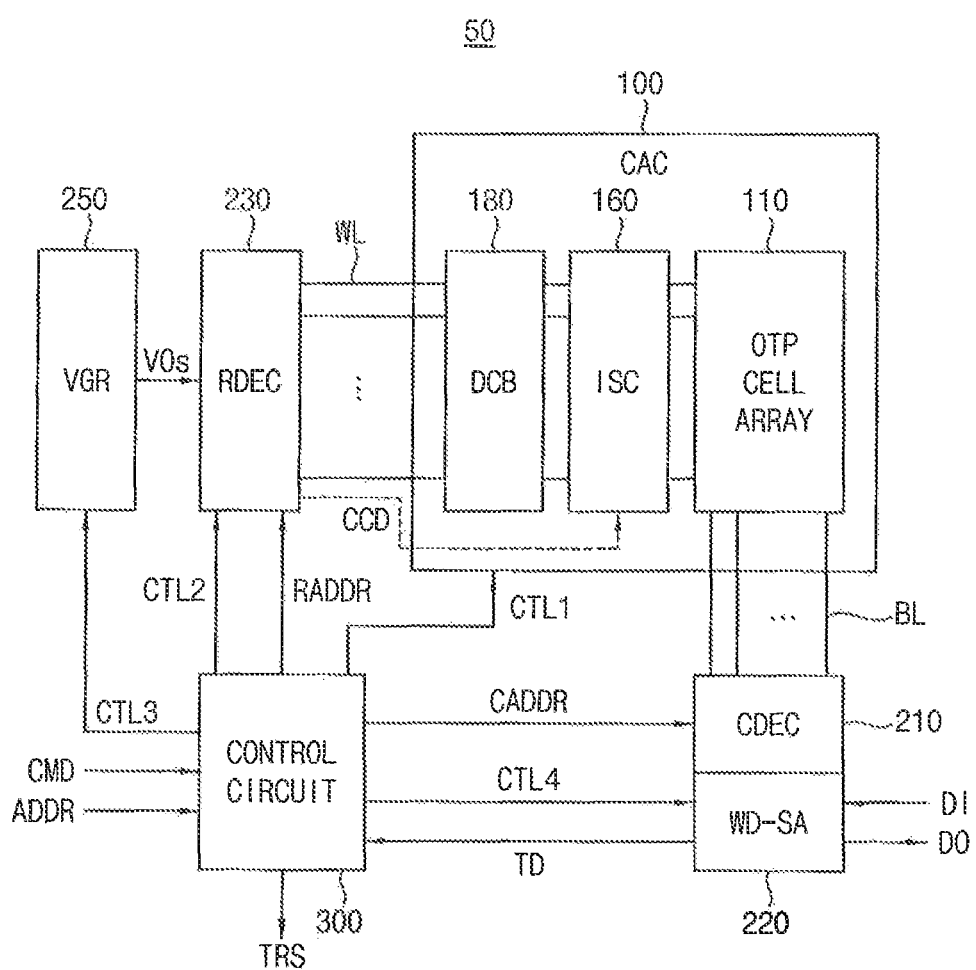
FIG. 1 is a block diagram illustrating a one-time programmable (OTP) memory device according to exemplary embodiments of the inventive concept.

Exemplary embodiments of the inventive concept provide a one-time programmable (OTP) memory device capable of increasing test credibility of peripheral circuits in the OTP memory device.

Exemplary embodiments of the inventive concept also provide a method of testing an OTP memory device capable of increasing test credibility of peripheral circuits in the OTP memory device.

Exemplary embodiments of the inventive concept will be described more fully hereinafter with reference to the accompanying drawings. Like reference numerals may refer to like elements throughout this application.

FIG. 1 is a block diagram illustrating an OTP memory device according to exemplary embodiments of the inventive concept.

Referring to FIG. 1, an OTP memory device 50 includes a cell array circuit (CAC) 100, a row decoder (RDEC) 230, a column decoder (CDEC) 210, a write-sensing circuit (WD-SA) 220, a voltage generator (VGR) 250 and a control circuit 300.

The cell array circuit 100 includes at least an OTP cell array 110, an isolation circuit (ISC) 160 and a dummy cell block (DCB) 180.

The OTP cell array 110 includes a plurality of OTP memory cells coupled to a plurality of bit-lines BL and a plurality of word-lines WL. The plurality of word-lines WI, may include a plurality of read word-lines WLR and a plurality of voltage word-lines WLP as will be described with reference to FIG. 2. The dummy cell block 180 may be coupled between the row decoder 230 and the isolation circuit 160 through the word-lines WL.

The isolation circuit 160 is coupled between the OTP cell array 110 and the dummy cell block 180. The isolation circuit 160 may cut off a first voltage and a second voltage which are transferred to the OTP cell array 110 from the row decoder 230, in response to control codes CCD in a first test mode. In exemplary embodiments of the inventive concept, the first voltage may be a read voltage applied to a read word-line WLR and the second voltage may be a program voltage applied to a voltage word-line WLP.

The control circuit 300 controls a test operation, a write operation and a read operation of the OTP memory device 50 based on a command CMD and an address ADDR received from an outside of the OTP memory device 50. The test operation may include a first test performed on a peripheral circuit in a first test mode and a second test performed on the OTP cell array 100 in a second test mode.

The control circuit 300 generates a first control signal CTL1 to control the OTP cell array 110, a second control signal CTL2 to control the row decoder 230, a third control signal CTL3 to control the voltage generator 250 and a fourth control signal CTL4 to control the write-sensing circuit 220 based on the command CMD. In addition, the control circuit 300 generates a row address RADDR and a column address CADDR based on the address ADDR. The control circuit 300 provides the row address RADDR to the row decoder 230 and provides the column address CADDR to the column decoder 210.

The column decoder 210 is coupled to the OTP cell array 110 through the bit-lines BL. The column decoder 210 selects some of the bit-lines BL based on the column address CADDR.

The write-sensing circuit 220 is coupled to the column decoder 210, writes input data DI in the OTP cell array 110 through the column decoder 210 and reads output data DO from the OTP cell array 110 through the column decoder 210 to provide the output data DO to the outside. In addition, the write-sensing circuit 220 may provide a test result pattern TD to the control circuit 300 in the first test mode. The control circuit 300 compares the test result pattern TD with an expected pattern and outputs a test result signal TRS indicating whether a peripheral circuit is defective based on a comparison of the test result pattern TD with the expected pattern.

The write-sensing circuit 220 may include a write driver and a sense amplifier. The sense amplifier may perform a read operation for sensing the data stored in the OTP memory cells and providing the read data to the outside as output data DO. The write driver may perform a write operation for storing the write data in the OTP memory cells. The write driver and the sense amplifier SA may be formed in a same circuit or device or may be formed in separate circuits or devices.

The row decoder 230 is coupled to the cell array circuit 100 through the word-lines WL. The row decoder 230 may determine one of the word-lines WL as a selected word-line and may determine the rest of the word-lines WL except the selected word-line as unselected word-lines based on the row address RADDR. In addition, the row decoder 230 may apply the control codes CCD to the isolation circuit 160 based on the second control signal CTL2 and the row address RADDR in the first test mode.

The voltage generator 250 generates operating voltages VOs under control of the control circuit 300 and provides the operating voltages VOs to the word-lines WLs through the row decoder 230.

Figure 2:
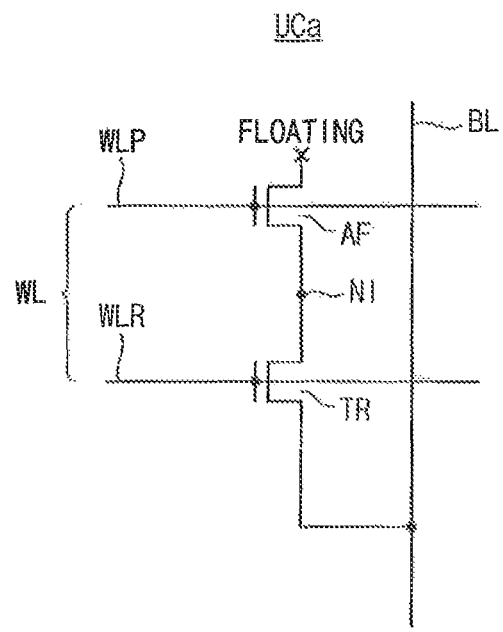
FIG. 2 illustrates an OTP memory cell in the OTP memory device of FIG. 1.

FIG. 2 illustrates an OTP memory cell in the OTP memory device 50 of FIG. 1.

Referring to FIG. 2, an OTP memory cell UCa may include an anti-fuse AF and a read transistor TR.

The anti-fuse AF may be connected between a corresponding voltage word-line WLP and an intermediate node NI. The read transistor TR may be connected between the intermediate node NI and a corresponding bit-line BL and may have a gate coupled to a corresponding read word-line WLR.

The anti-fuse AF may include, for example, a metal-oxide semiconductor (MOS) transistor. In an exemplary embodiment of the inventive concept, as illustrated in FIG. 2, a drain electrode of the MOS transistor AF may be floated, a source electrode of the MOS transistor AF may be connected to the intermediate node NI, and a gate electrode of the MOS transistor AF may be connected to the voltage word-line WLP.

The anti-fuse AF is an example element of the OTP memory cell. In an embodiment of the inventive concept, the anti-fuse AF may have electrical features opposite that of a typical fuse, e.g., the anti-fuse AF may have a higher resistance value in an un-programmed state and a lower resistance value in a programmed state.

In another embodiment of the inventive concept, the anti-fuse AF may include a dielectric material between two conductors. The dielectric material may be broken and programmed by applying a high voltage between the two conductors for a sufficient time. When programmed in this manner, the two conductors may be electrically connected through the broken dielectric material. Thus, the anti-fuse AF may have the lower resistance value. In an anti-fuse type OTP memory, a MOS capacitor may have a thin gate oxide that is used as the anti-fuse AF. A high voltage may be applied between the two electrodes of the MOS capacitor to program the MOS capacitor. An OTP memory cell using a MOS capacitor may have a small cell area and a low program current. Thus, low power and byte-wide programming may be achieved.

A program voltage of a relatively high voltage level may be applied to the voltage word-line WLP in a program mode. A read voltage having a lower voltage level than the program voltage may be applied to the voltage word-line WLP in a read mode. A selection voltage with a voltage level sufficient to turn on the read transistor TR may be applied to the read word-line WLR in the program and read modes.

In the program mode, a program permission voltage may be applied to the bit-lines connected to the OTP memory cells to be programmed and a program inhibition voltage greater than the program permission voltage may be applied to the bit-lines connected to the OTP memory cells that are not to be programmed. For example, the program permission voltage may be set to ground voltage, and/or the program inhibition voltage and the read voltage may be set to a power supply voltage. The voltage levels of the program voltage, the read voltage, the program permission voltage, and/or the program inhibition voltage may be different in other embodiments of the inventive concept, for example, depending on the characteristics and/or configuration of the OTP memory cells.

The programming of the anti-fuse AF may be performed in the program mode. For example, in the program mode, the program voltage may be applied to the voltage word-line WLP, the selection voltage may be applied to the read word-line WLR to turn on the read transistor TR, and the program permission voltage may be applied to the bit-line BL.

Figure 3:
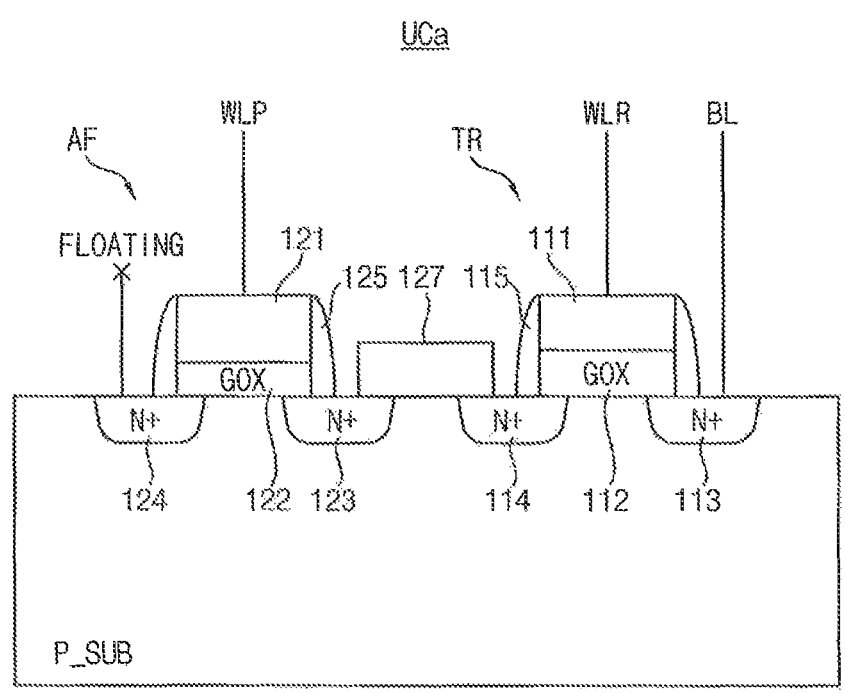
FIG. 3 is a cross-sectional view of the OTP memory cell of FIG. 2.

FIG. 3 is a cross-sectional view of the OTP memory cell UCa of FIG. 2.

Referring to FIG. 3, the OTP memory cell UCa may include an anti-fuse AF and a read transistor TR on a same substrate P_SUB.

The read transistor TR may include a first gate 111 connected to a corresponding read word-line WLR, a first gate insulation layer (GOX) 112 insulating the first gate 111 from the substrate P-SUB, a first source region 113 connected to a corresponding bit-line BL, and a first drain region 114.

The anti-fuse AF may include a second gate 121 connected to a corresponding voltage word-line WLP, a second gate insulation layer 122 insulating the second gate 121 from the substrate P_SUB, a second source region 123 connected to the first drain region 114 of the read transistor TR, and a second drain region 124 that is floated.

The second source region 123 of the anti-fuse AF may be electrically connected to the first drain region 114 of the read transistor TR by a conduction path 127. The conduction path 127 may include metal lines in an upper space and an interlayer structure such as vias for connecting the metal lines to the upper surface of the substrate P_SUB. For example, the vias on a first side of the conduction path 127 may be connected to the second source region 123 and the vias on a second side of the conduction path 127 may be connected the first drain region 114. In some exemplary embodiments of the inventive concept, the second source region 123 of the anti-fuse AF and the first drain region 114 of the read transistor TR may be combined. In such a case, the conduction path 127 may be omitted.

For example, the substrate P_SUB may be doped with p-type impurities, and the first and second source regions 113 and 123 and the first and second drain regions 114 and 124 may be doped with n-type impurities.

The read transistor TR may further include a first spacer 115 on sidewalls of the first gate 111 and the first gate insulation layer 112. The anti-fuse AF may further include a second spacer 125 on sidewalls of the second gate 121 and the second gate insulation layer 122.

Figure 4:
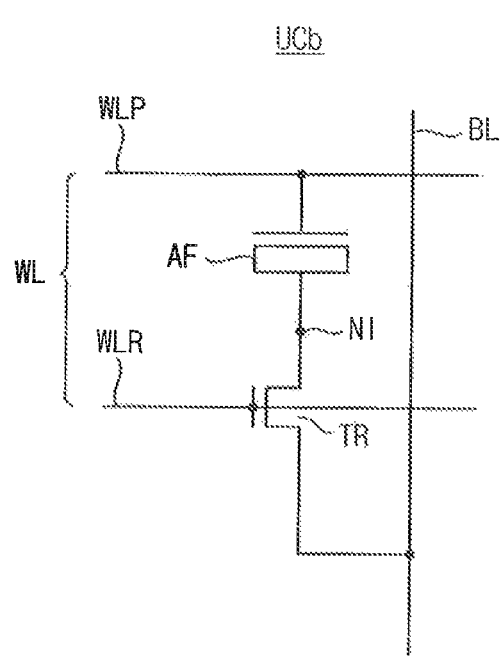
FIG. 4 illustrates another OTP memory cell in the OTP memory device of FIG. 1.

FIG. 4 illustrates another OTP memory cell in the OTP memory device 50 of FIG. 1.

Referring to FIG. 4, an OTP memory cell UCb may include an anti-fuse AF and a read transistor TR. The anti-fuse AF may be connected between a corresponding voltage word-line WLP and an intermediate node NI. The read transistor TR may be connected between the intermediate node NI and a corresponding bit-line BL. A gate electrode of the read transistor TR may be connected to a corresponding read word-line WLR.

The anti-fuse AF may include, for example, a MOS capacitor. In an exemplary embodiment of the inventive concept, as illustrated in FIG. 4, a first electrode of the MOS capacitor may be connected to the voltage word-line WLP and a second electrode of the MOS capacitor may be connected to the intermediate node NI.

The structure and the manufacturing process of the OTP memory cell UCb of FIG. 4 may be similar, for example, to the OTP memory cell UCa of FIG. 3. To implement the MOS capacitor, a conduction path may be added to connect the second source region 123 and the second drain region 124 in FIG. 3.

Figure 5:
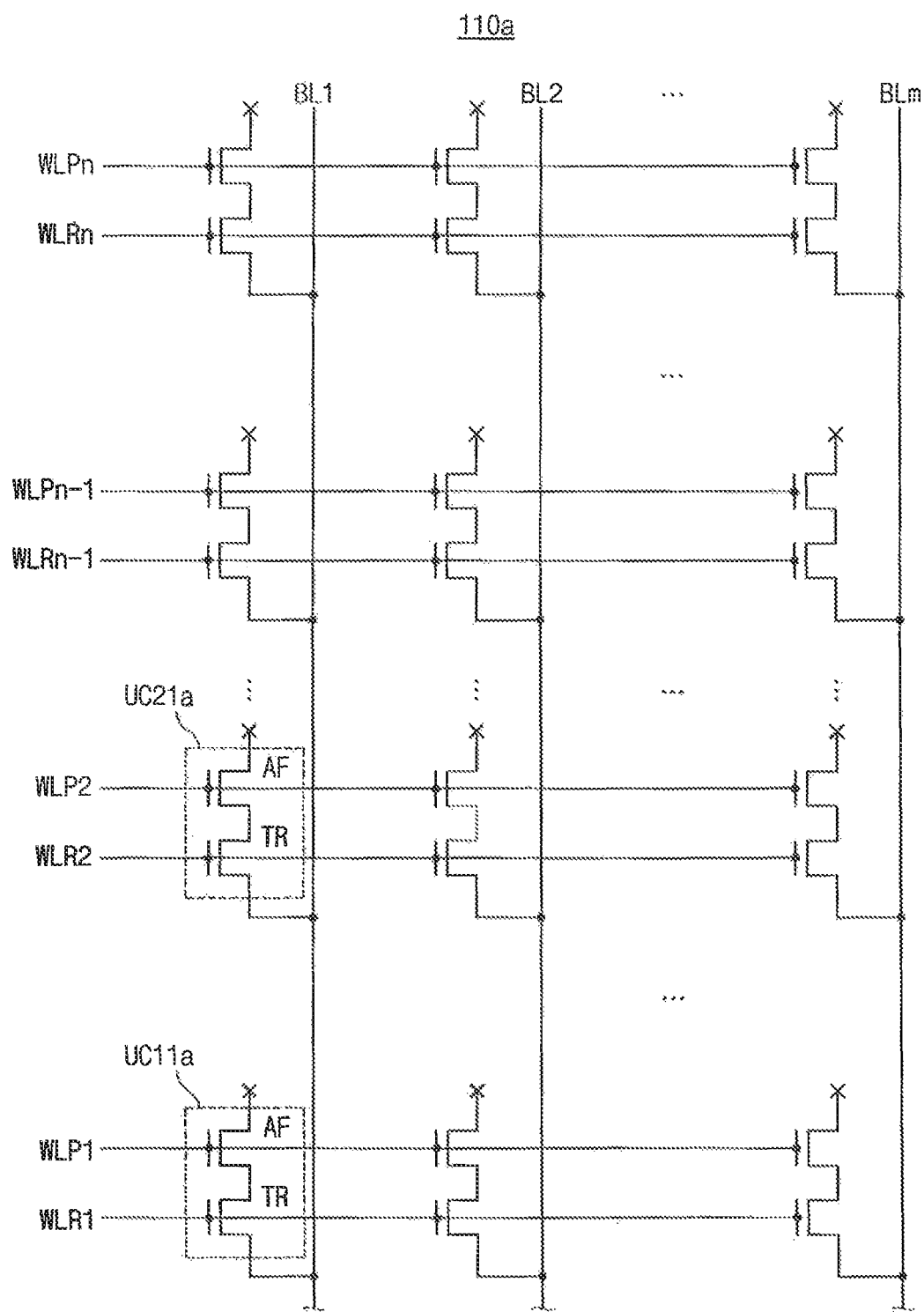
FIG. 5 is a circuit diagram illustrating an OTP cell array included in the OTP memory device of FIG. 1.

FIG. 5 is a circuit diagram illustrating an OTP cell array included in the OTP memory device 50 of FIG. 1.

Referring to FIG. 5, an OTP cell array 110a may include a plurality of OTP memory cells UC11a and UC21a that are coupled to a plurality of bit-lines BL1~BLm, a plurality of voltage word lines WLP1~WLPn and a plurality of read word lines WLR1~WLRn, respectively, and arranged in an n*m matrix. Here, n and m are positive integers.

The gate electrode of the read transistor TR may be connected to the corresponding read word-line WLRx (x=1~n) and the source electrode of the read transistor TR may be connected to the corresponding bit-line BLy (y=1~nm).

The first electrode of the anti-fuse AF may be connected to the corresponding word-line WLPx and the second electrode of the anti-fuse AF may be connected to the drain electrode of the read transistor TR. Here, the first electrode of the anti-fuse AF may be a gate electrode, and the second electrode of the anti-fuse AF may be source electrode.

As described above, the anti-fuse AF may be a MOS transistor. The gate electrode or the first electrode of the MOS transistor AF may be connected to the corresponding voltage word-line WLPx, the source electrode or the second electrode of the MOS transistor AF may be connected to the drain electrode of the read transistor TR and the drain electrode of the MOS transistor AF may be floated.

Each of the OTP memory cells UC11aa and UC21 may include the anti-fuse AF and the read transistor TR.

Figure 6:
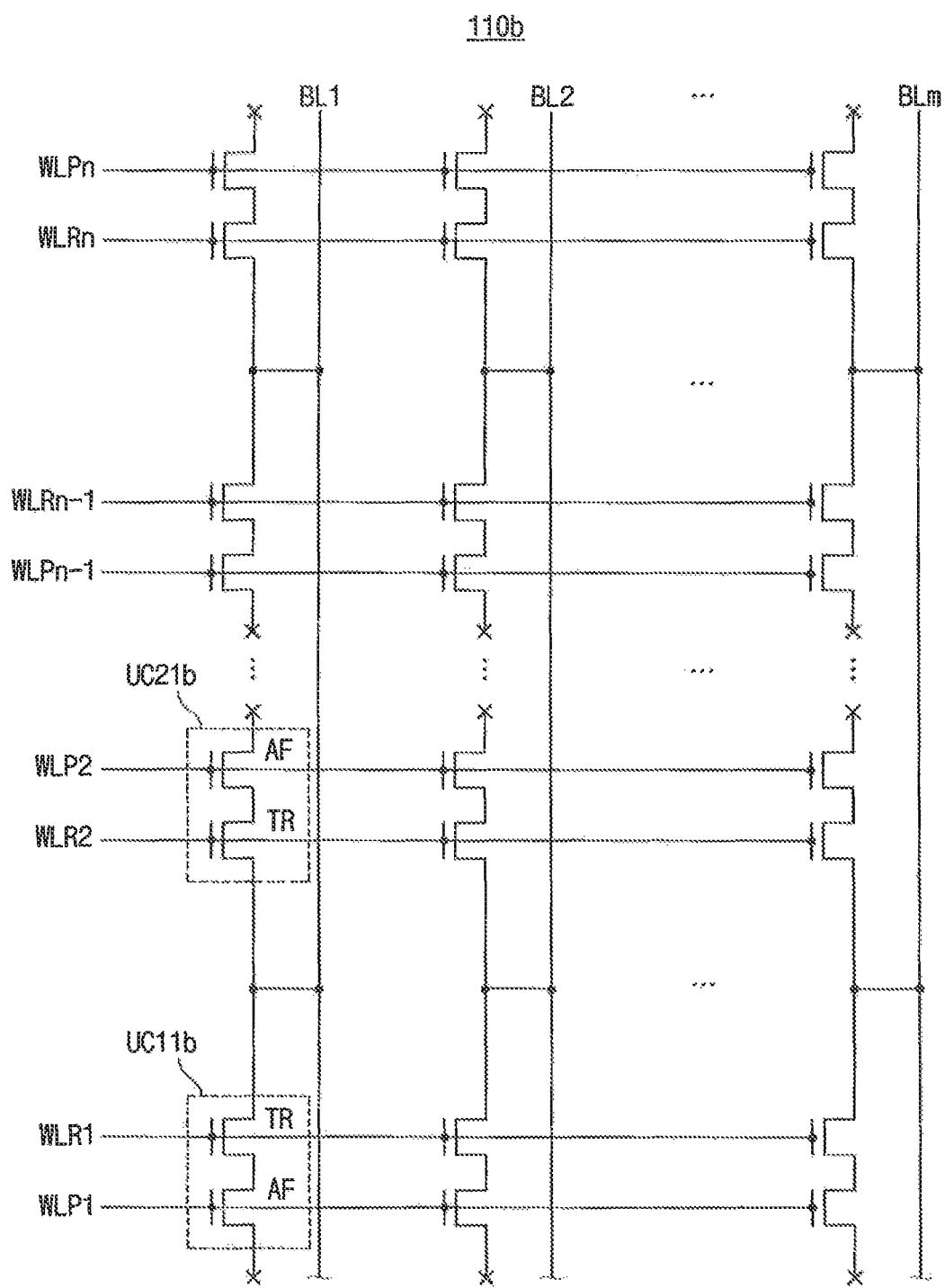
FIG. 6 is a circuit diagram illustrating another OTP cell array included in the OTP memory device of FIG. 1.

FIG. 6 is a circuit diagram illustrating another OTP cell array included in the OTP memory device 50 of FIG. 1.

Referring to FIG. 6, an OTP cell array 110b may include a plurality of OTP memory cells UC11b and UC21b that are coupled to a plurality of bit-lines BL1~BLm, a plurality of voltage word-lines WLP1~WLPn and a plurality of read word-lines WLR1~WLRn, respectively, and arranged in an n*m matrix.

The OTP cell array 110b of FIG. 6 differs from the OTP cell array 110a of FIG. 5 in that two OTP memory cells UC11b and UC21b constitute a pair. In other words, the read transistors TR in the adjacent two OTP memory cells are commonly coupled to a corresponding bit-line BL at a common node.

Figure 7:
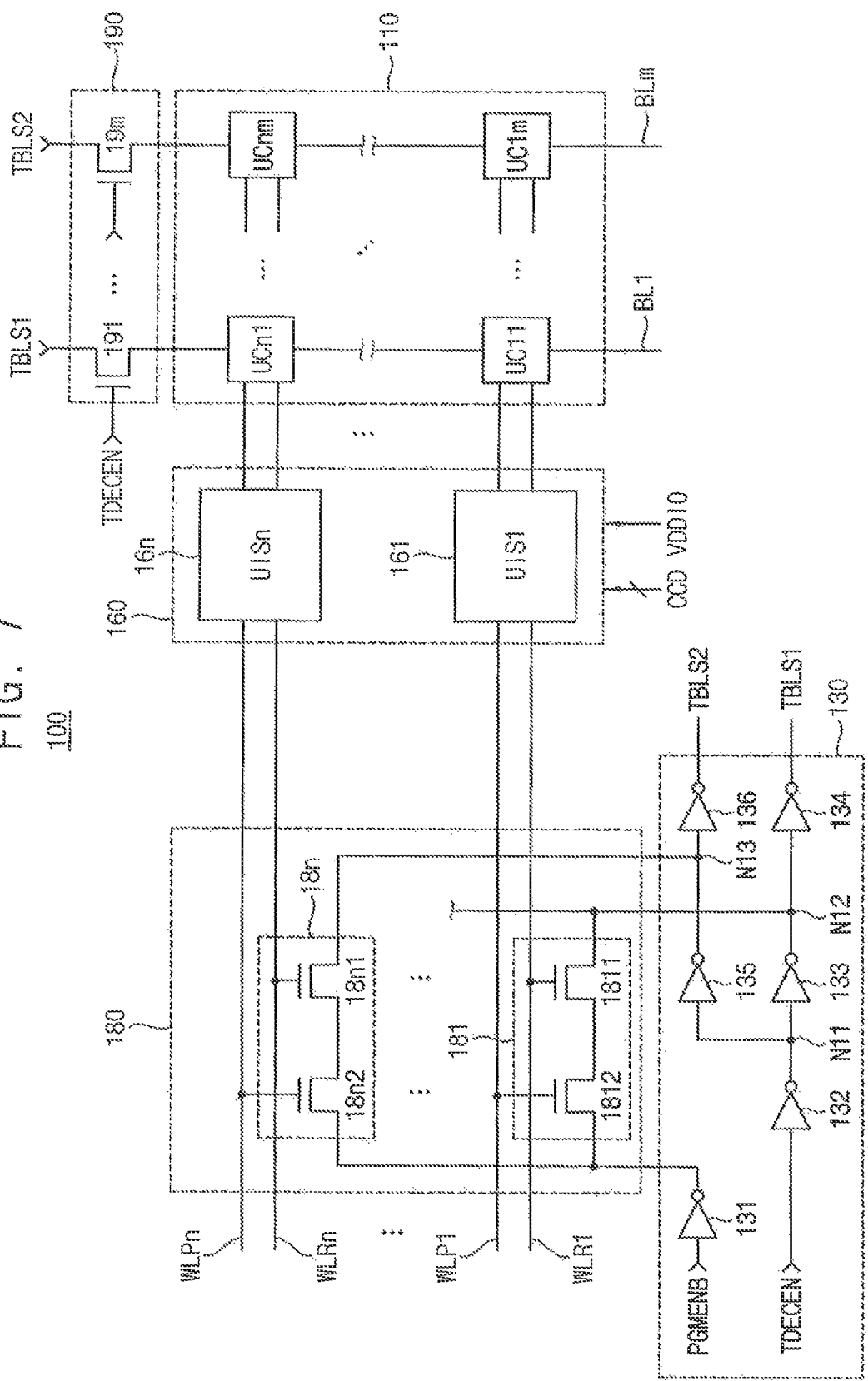
FIG. 7 is a circuit diagram illustrating a cell array circuit included in the OTP memory device of FIG. 1 according to exemplary embodiments of the inventive concept.

FIG. 7 is a circuit diagram illustrating a cell array circuit included in the OTP memory device 50 of FIG. 1 according to exemplary embodiments of the inventive concept.

Referring to FIG. 7, the cell array circuit 100 includes the OTP cell array 110, the isolation circuit 160, the dummy cell block 180, a test bit-line signal generator 130 and a switch circuit 190.

The OTP cell array 110 includes a plurality of OTP memory cells UC11~UCnm that are coupled to the plurality of bit-lines BL1~BLm, the plurality of voltage word-lines WLP1~WLPn and the plurality of read word-lines WLR1~WLRn, respectively, and arranged in an n*m matrix.

The isolation circuit 160 includes a plurality unit isolation circuits (UIS1~UISn) 161~16n coupled to the plurality of voltage word-lines WLP1~WLPn and the plurality of read word-lines WLR1~WLRn. The isolation circuit 160 may receive the control code CCD and a power supply voltage VDDIO.

The dummy cell block 180 includes a plurality of unit dummy cells 181~18n and each of the unit dummy cells 181~18n is coupled to a corresponding pair of a read word-line and a voltage word-line of the read word-lines WLR1~WLRn and the voltage word-lines WLP1~WLPn. The dummy cell block 180 may be coupled to the test bit-line signal generator 130.

The unit dummy cell 181 includes a first transistor 1811 and a second transistor 1812. The first transistor 1811 has a gate coupled to the read word-line WLR1 and the second transistor 1812 has a gate coupled to the voltage word-line WLP1. A first electrode of the first transistor 1811 and a first electrode of the second transistor 1812 may be coupled to each other. The unit dummy cell 18n includes a first transistor 18n1 and a second transistor 18n2. The first transistor 18n1 has a gate coupled to the read word-line WLRn and the second transistor 18n2 has a gate coupled to the voltage word-line WLPn. A first electrode of the first transistor 18n1 and a first electrode of the second transistor 18n2 may be coupled to each other.

The unit dummy cells 181~18n may include a first set of unit dummy cells coupled to a first group of read word-lines (e.g., odd read word-lines) and voltage word-lines (e.g., odd voltage word-lines) among the read word-lines WLR1~WLRn and the voltage word-lines WLP1~WLPn and a second set of unit dummy cells coupled to a second group of read word-lines (e.g., even read word-lines) and voltage word-lines (e.g., even voltage word-lines).

The test bit-line signal generator 130 may include first, second, third, fourth, fifth and sixth inverters 131, 132, 133, 134, 135 and 136.

The first inverter 131 includes an input for receiving a program control signal PGMENB and an output coupled to the second terminal of the second transistor of each of the first set of unit dummy cells and the second terminal of the second transistor of each of the second set of unit dummy cells. In other words, the first inverter 131 has its output coupled to the second terminal of each of the unit dummy cells 181~18n. The second inverter 132 includes an input for receiving a first test enable signal TDECEN and an output coupled to a first node N11. The third inverter 133 includes an input coupled to the first node N11 and an output coupled to the second terminal of the first transistor of each of the first set of unit dummy cells at the second node N12.

The fourth inverter 134 includes an input coupled to the second node N12 and an output for providing a first test bit-line signal TBLS1. The fifth inverter 135 includes an input coupled to the first node N11 and an output coupled to the second terminal of the first transistor of each of the second set of unit dummy cells at a third node N13. The sixth inverter 136 includes an input coupled to the third node N13 and an output for providing a second test bit-line signal TBLS2.

In the first test mode, the program control signal PGMENB and the first test enable signal TDECEN have a logic high level, respectively.

If the program control signal PGMENB and the first test enable signal TDECEN have a logic high level in the first test mode and a first pair of a read word-line and a voltage word-line is selected from the first group of read word-lines and voltage word-lines, a first current path is formed from the second node N12 to the first inverter 131 through a first unit dummy cell. Here, the first unit dummy cell is coupled to the first selected pair, included in the first set of unit dummy cells and thus logic levels of the first test bit-line signal TBLS1 and the second test bit-line signal TBLS2 may be determined.

In addition, if a second pair of a read word-line and a voltage word-line is selected from the second group of read word-lines and voltage word-lines in the first test mode, a second current path is formed from the third node N13 to the first inverter 131 through a first unit dummy cell. Here, the first unit dummy cell is coupled to the second selected pair, included in the second set of unit dummy cells and thus logic levels of the first test bit-line signal TBLS1 and the second test bit-line signal TBLS2 may be determined.

The switch circuit 190 includes a plurality of switches 191~19n coupled to the bit-lines BL1~BLm and the plurality of switches 191~19n transfer the first test bit-line signal TBLS1 and the second test bit-line signal TBLS2 to the bit-lines BL1~BLm in response to the first test enable signal TDECEN. The bit-lines BL1~BLm may include a first group of bit-lines and a second group of bit-lines. In an exemplary embodiment of the inventive concept, the first group of bit-lines may correspond to odd bit-lines and the second group of bit-lines may correspond to even bit-lines.

In an exemplary embodiment of the inventive concept, the plurality of switches 191~19n transfer the first test bit-line signal TBLS1 to the first group of bit-lines and transfer the second test bit-line signal TBLS2 to the second group of bit-lines. Alternatively, the plurality of switches 191~19n transfer the first test bit-line signal TBLS1 to the second group of bit-lines and transfer the second test bit-line signal TBLS2 to the first group of bit-lines.

Figure 8:
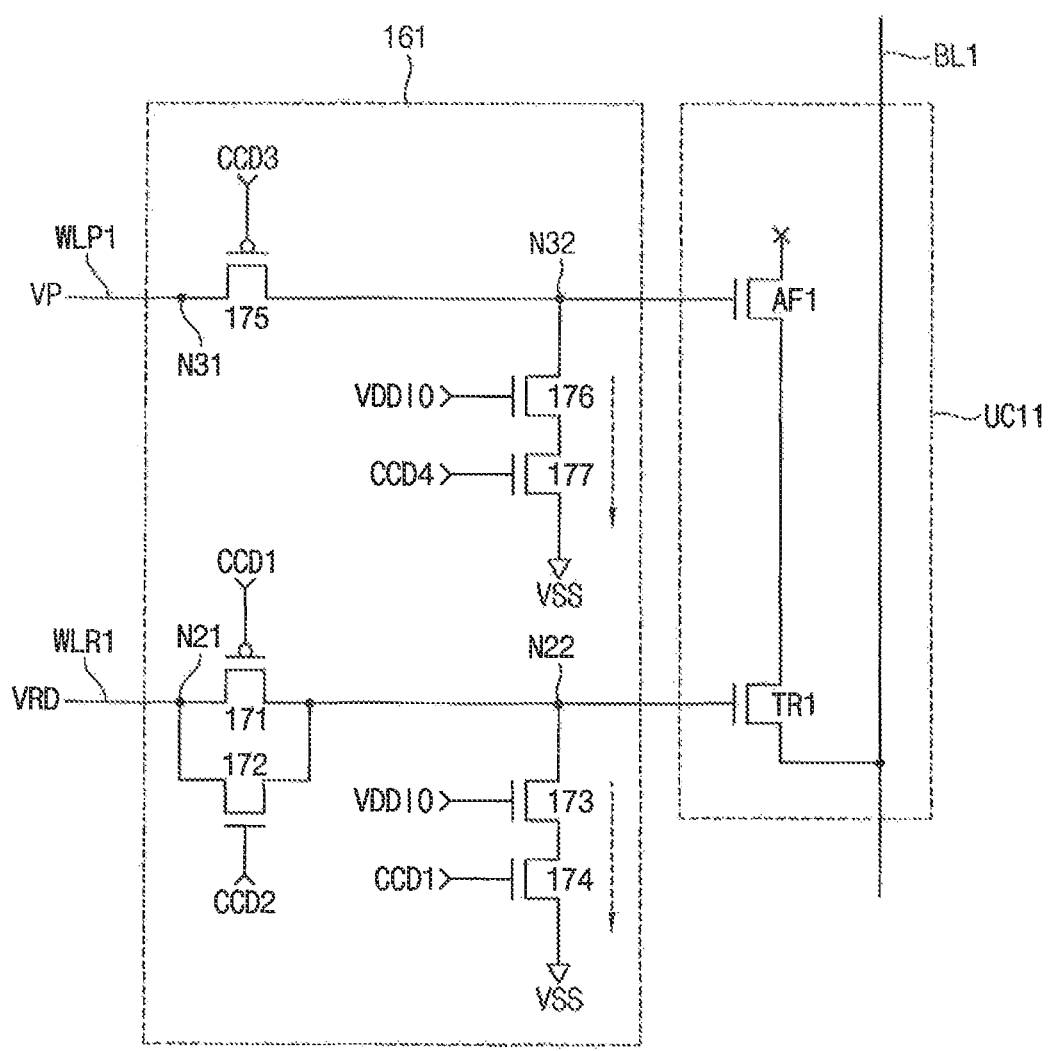
FIG. 8 is a circuit diagram illustrating a unit isolation circuit included in an isolation circuit in FIG. 7.

FIG. 8 is a circuit diagram illustrating a unit isolation circuit included in the isolation circuit 160 in FIG. 7.

In FIG. 8, a configuration of the unit isolation circuit 161 is illustrated. However, each of the unit isolation circuits 162~61n may have the same configuration as the unit isolation circuit 161.

Referring to FIG. 8, the unit isolation circuit 161 includes a p-channel metal-oxide semiconductor (PMOS) transistor 171, n-channel metal-oxide semiconductor (NMOS) transistors 172, 173 and 174, a PMOS transistor 175 and NMOS transistors 176 and 177.

The PMOS transistor 171 is coupled to the row decoder 230 at a first node N21 of the read word-line WLR1, is coupled to the read transistor TR1 of the OTP memory cell UC11 at a second node N22 of the read word-line WLR1 and has a gate for receiving a first control code CCD1. The NMOS transistor 172 is coupled between the first node N21 and the second node N22 in parallel with the PMOS transistor 171, and has a gate for receiving a second control code CCD2. The NMOS transistors 173 and 174 are coupled in series between the second node N22 and a ground voltage VSS. The NMOS transistor 173 has a gate coupled to the power supply voltage VDDIO and the NMOS transistor 174 has a gate for receiving the first control code CCD1.

The PMOS transistor 175 is coupled to the row decoder 230 at a first node N31 of the voltage word-line WLP1, is coupled to the anti-fuse AF of the OTP memory cell UC11 at a second node N32 of the voltage word-line WLP1 and has a gate for receiving a third control code CCD3. The NMOS transistors 176 and 177 are coupled in series between the second node N32 and the ground voltage VSS. The NMOS transistor 176 has a gate coupled to the power supply voltage VDDIO and the NMOS transistor 177 has a gate for receiving a fourth control code CCD4.

In the first test mode, the first through fourth control codes CCD1~CCD4 may have a logic high level, respectively. Therefore, the unit isolation circuit 161 cuts off a first voltage (e.g., a read voltage VRD) to be applied to the read word-line WLR1 and a second voltage (e.g., a program voltage VP) to be applied to the voltage word-line WLP1 by discharging the first voltage VRD to the ground voltage VSS and by discharging the second voltage VP to the ground voltage VSS in the first test mode.

Figure 9:
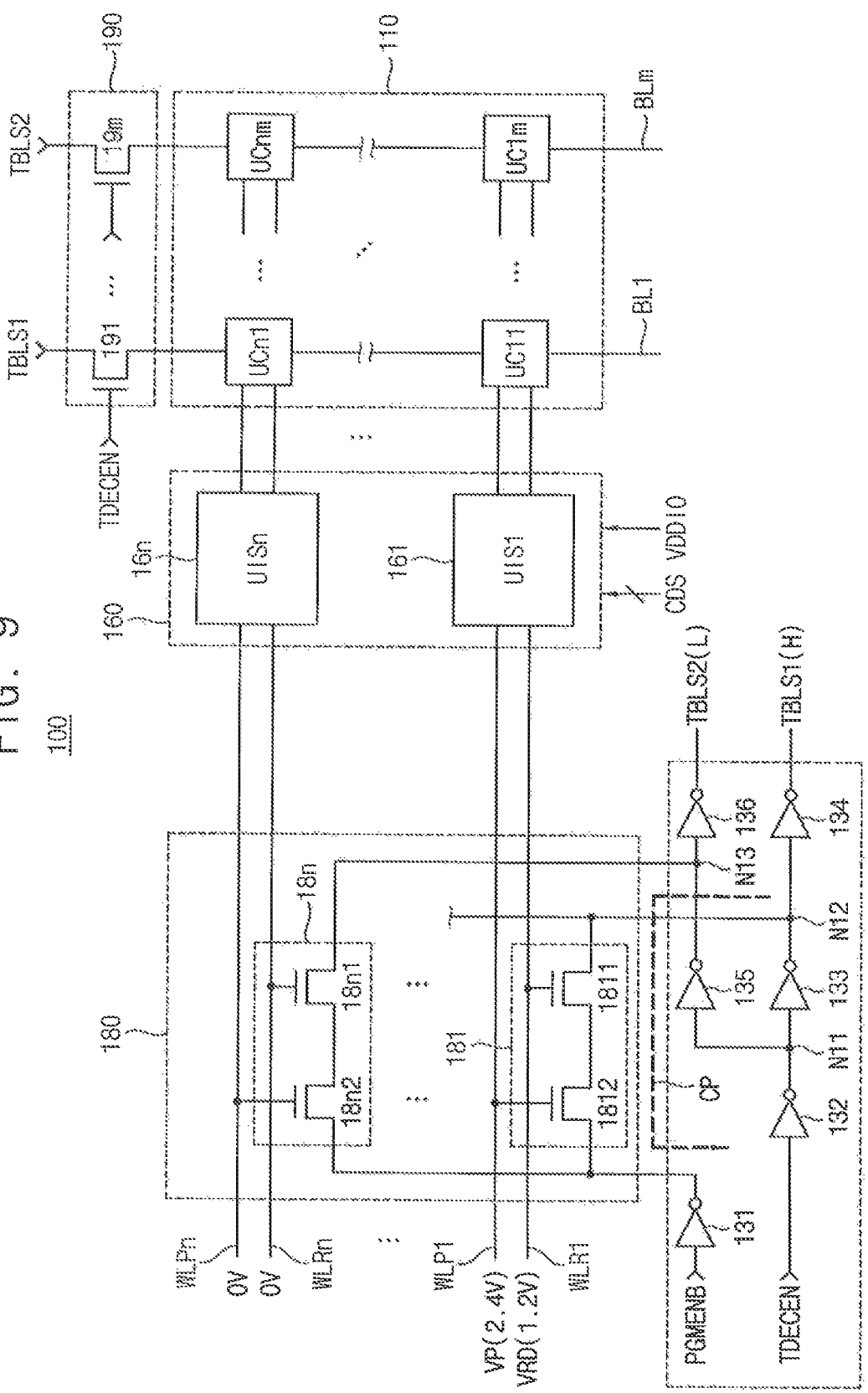
FIG. 9 illustrates an operation of the cell array circuit of FIG. 7 in a first test mode.

FIG. 9 illustrates an example operation of the cell array circuit 100 of FIG. 7 in a first test mode.

Referring to FIGS. 7 through 9, for a pair of the read word-line WLR1 and the voltage word-line WLP1 in the first test mode, the row decoder 230 provides the first voltage VRD to the read word-line WLR1, provides the second voltage VP to the voltage word-line WLP1, and provides a ground voltage (e.g., 0V) to unselected word-lines. Here, the first voltage VRD may be 1.2V and the second voltage VP may be 2.4V. The unit isolation circuit 161 cuts off the first voltage VRD and the second voltage VP provided to the OTP cell array 110 and the first transistor 1811 and the second transistor 1812 in the unit dummy cell 181 are turned-on. Therefore, a current path CP is formed from the second node N12 to the first inverter 131 through the unit dummy cell 181.

First and second transistors in each of the other unit dummy cells 182~18n are turned-off by applying the ground voltage to the unselected pairs of read word-lines and voltage word-lines. Accordingly, the second node N12 transits from a high level to low level, and the third node N13 is maintained with a high level. Therefore, the fourth inverter 134 provides the first test bit-line signal TBLS1 having a high level to the first group of bit-lines through the switch circuit 190 and the sixth inverter 136 provides the second test bit-line signal TBLS2 having a low level to the second group of bit-lines through the switch circuit 190.

Since the isolation circuit 160 cuts off the provision of the first voltage VRD and the second voltage VP to the OTP cell array 110, the write-sensing circuit 220 in FIG. 1 outputs the test result pattern TD to the control circuit 300, which responds to the first and second test bit-line signals TBLS1 and TBLS2 without regard to defects of the OTP memory cells of the OTP cell array 110.

If the test result pattern TD corresponds to a first pattern or a second pattern in which '0' and '1' are alternatingly repeated, the test result pattern TD indicates that the row decoder 230 and the column decoder 210 are not defective. If the test result pattern TD does not correspond to the first pattern or the second pattern, the test result pattern TD indicates that at least one of the row decoder 230 and the column decoder 210 is defective.

The row decoder 230 may sequentially control the word-lines WL and the column decoder 210 may sequentially control the bit-lines BL.

Accordingly, the OTP memory device 50 according to exemplary embodiments of the inventive concept including the isolation circuit 160 may perform a first test on the row decoder 230 and the column decoder 210 without being affected by states of the OTP memory cells of the OTP cell array 110.

Figure 10:
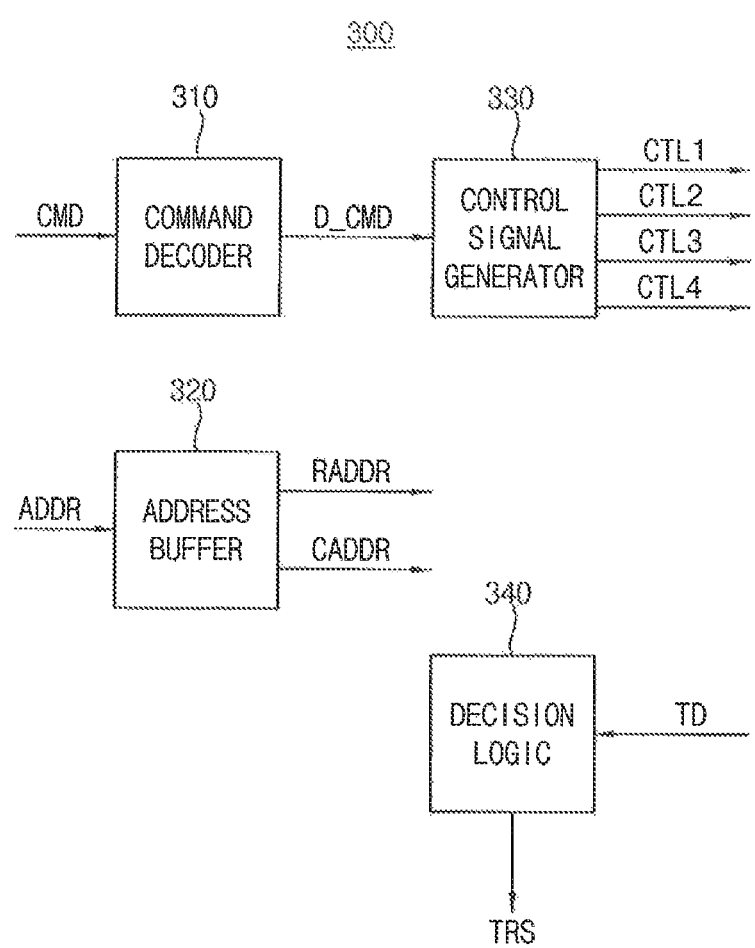
FIG. 10 is a block diagram illustrating a control circuit in the OTP memory device of FIG. 1.

FIG. 10 is a block diagram illustrating the control circuit in the OTP memory device 50 of FIG. 1.

Referring to FIG. 10, the control circuit 300 may include a command decoder 310, an address buffer 320, a control signal generator 330 and a decision logic 340.

The command decoder 310 decodes the command CMD and provides a decoded command D_CMD to the control signal generator 330. The address buffer 320 receives the address ADDR, provides the row address RADDR to the row decoder 230 and provides the column address CADDR to the column decoder 210.

The control signal generator 330 receives the decoded command D_CMD, generates the control signals CTL1~CTL4 based on an operation directed by the decoded command D_CMD and provides the control signals CTL1~CTL4 to corresponding elements respectively. The decision logic 340, in the first test mode, receives the test result pattern TD and outputs the test result signal TRS based on a comparison of the test result pattern TD and an expected pattern. The test result signal TRS may indicate whether the row decoder 230 and the column decoder 210 have defects.

Figure 11:
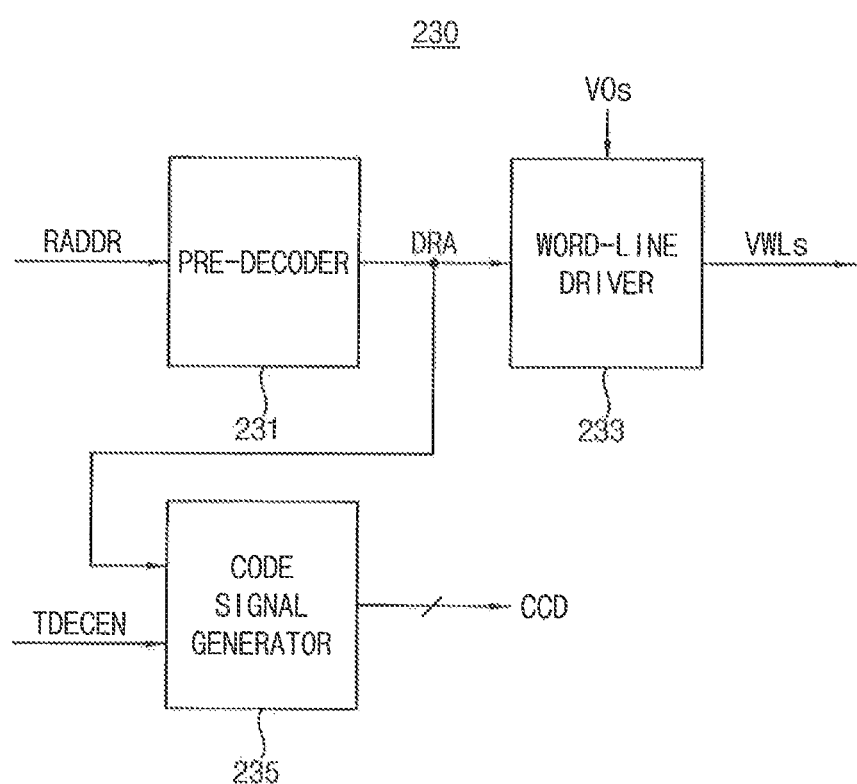
FIG. 11 is a block diagram illustrating a row decoder in the OTP memory device of FIG. 1.

FIG. 11 is a block diagram illustrating the row decoder in the OTP memory device 50 of FIG. 1.

Referring to FIG. 11, the row decoder 230 may include a pre-decoder 231, a word-line driver 233 and a code signal generator 235.

The pre-decoder 231 receives the row address RADDR, decodes the row address RADDR and provides a decoded row address DRA to the word-line driver 233 and the code signal generator 235. The word-line driver 233 receives the operating voltages VOs and transfers at least some of the operating voltages VOs as word line voltages VWLs to the word-lines in response to the decoded row address DRA. The code signal generator 235 receives the first test enable signal TDECEN and the decoded row address DRA in the first test mode, and provides the control codes CCD to a unit isolation circuit coupled to a word-line corresponding to the decoded row address DRA.

Figure 12:
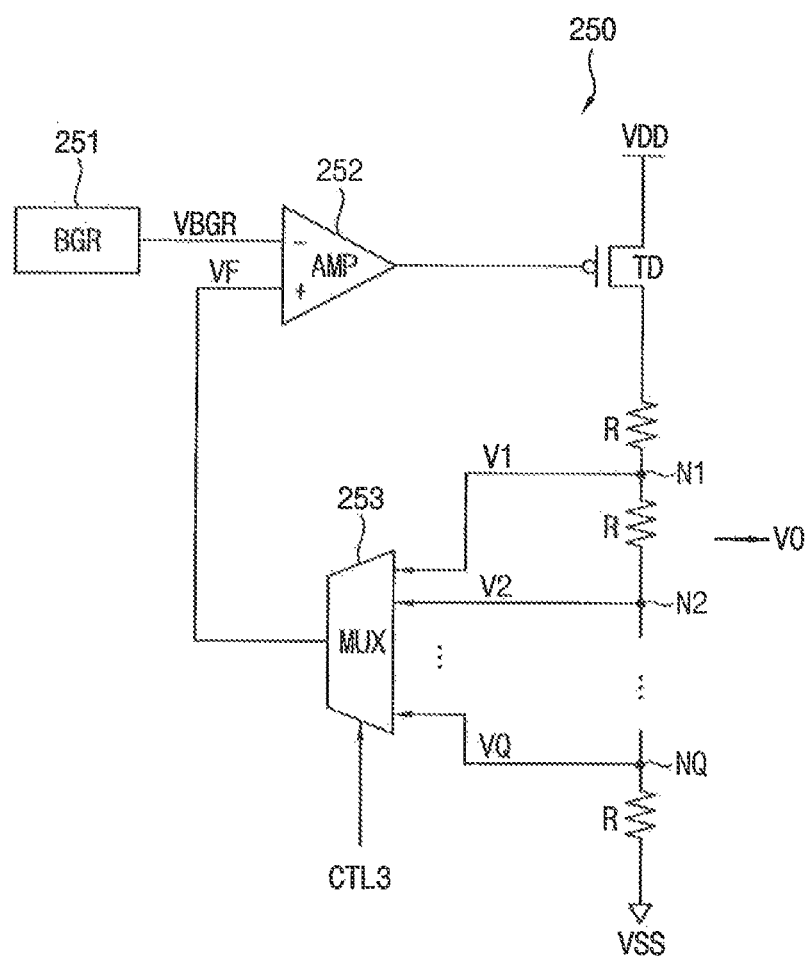
FIG. 12 is a block diagram illustrating a voltage generator in the OTP memory device of FIG. 1.

FIG. 12 is a block diagram illustrating the voltage generator in the OTP memory device 50 of FIG. 1.

Referring to FIG. 12, a voltage generator 250 may include a band gap reference circuit (BGR) 251, an operational amplifier (AMP) 252, a driving transistor TD, division resistors R and a multiplexer (MUX) 253.

The operational amplifier 252 may amplify a difference between a band gap reference voltage VBGR and a feedback voltage VF to output an amplified voltage. The driving transistor TD is connected to a power supply voltage VDD to generate a driving current corresponding to the amplified voltage of the operational amplifier 252. The division resistors R are connected in series between the driving transistor TD and the ground voltage VSS to provide divided voltages V1~VQ through division nodes N1~NQ. The multiplexer 253 may select one of the division voltages V1~VQ based on the third control signal CTL3 to provide the selected one of the division voltages V1~VQ as the feedback voltage. VF. An operating voltage VO may be provided at one of the division nodes N1~NQ.

Figure 13:
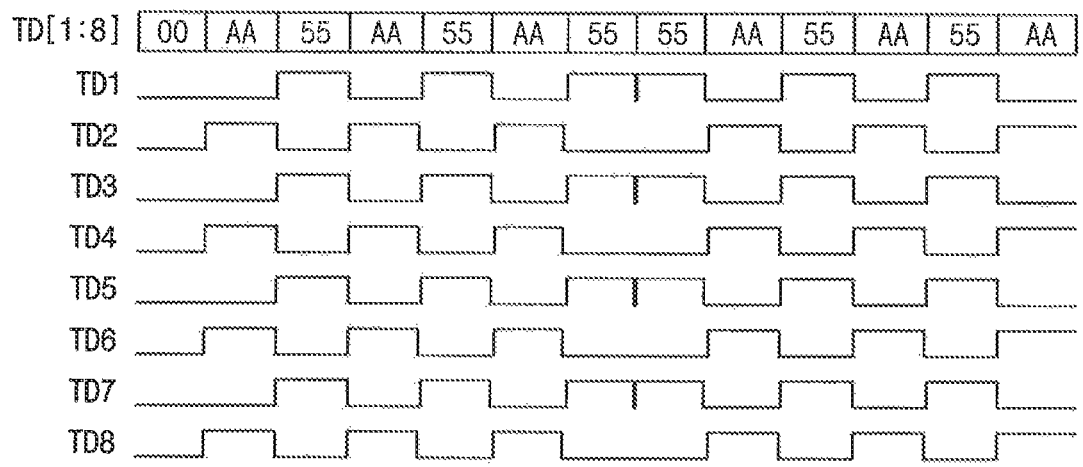
FIGS. 13 and 14 respectively illustrate test result patterns that the OTP memory device of FIG. 1 provides in a first test mode.
Figure 14:
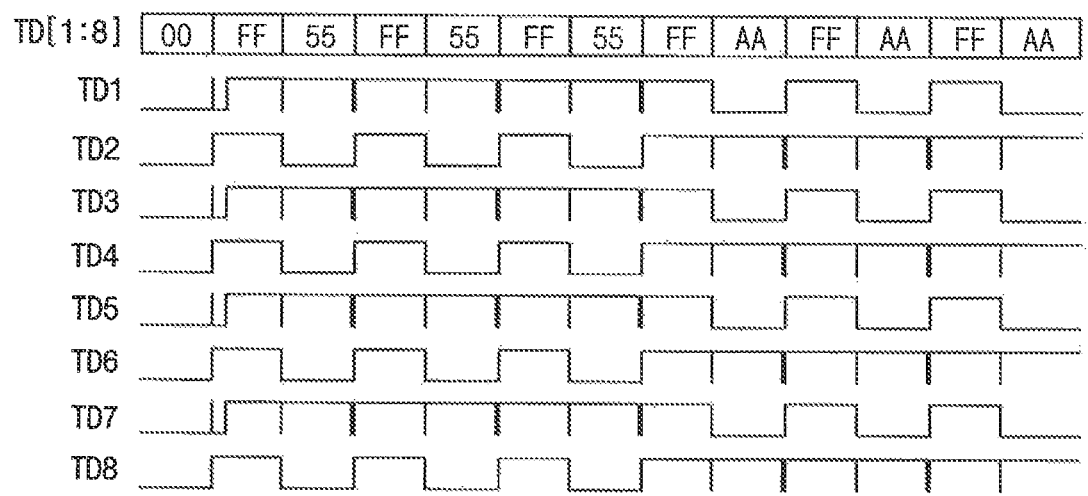

FIGS. 13 and 14 respectively illustrate test result patterns which the OTP memory device 50 of FIG. 1 provides in the first test mode.

Referring to FIGS. 1 and 13, if the row decoder 230 and the column decoder 210 do not have defects in the first test performed on the OTP memory device 50, the write-sensing circuit 220 may output test result pattern TD1~TD8 corresponding to a first pattern AA'h or a second pattern 55'h in which '0' and '1' are alternatingly repeated.

Referring to FIGS. 1 and 14, if at least one of the row decoder 230 and the column decoder 210 has defects in the first test performed on the OTP memory device 50, the write-sensing circuit 220 may output test result pattern TD1~TD8 corresponding to a pattern FF'h in which '1' are alternatingly repeated.

Figure 15:
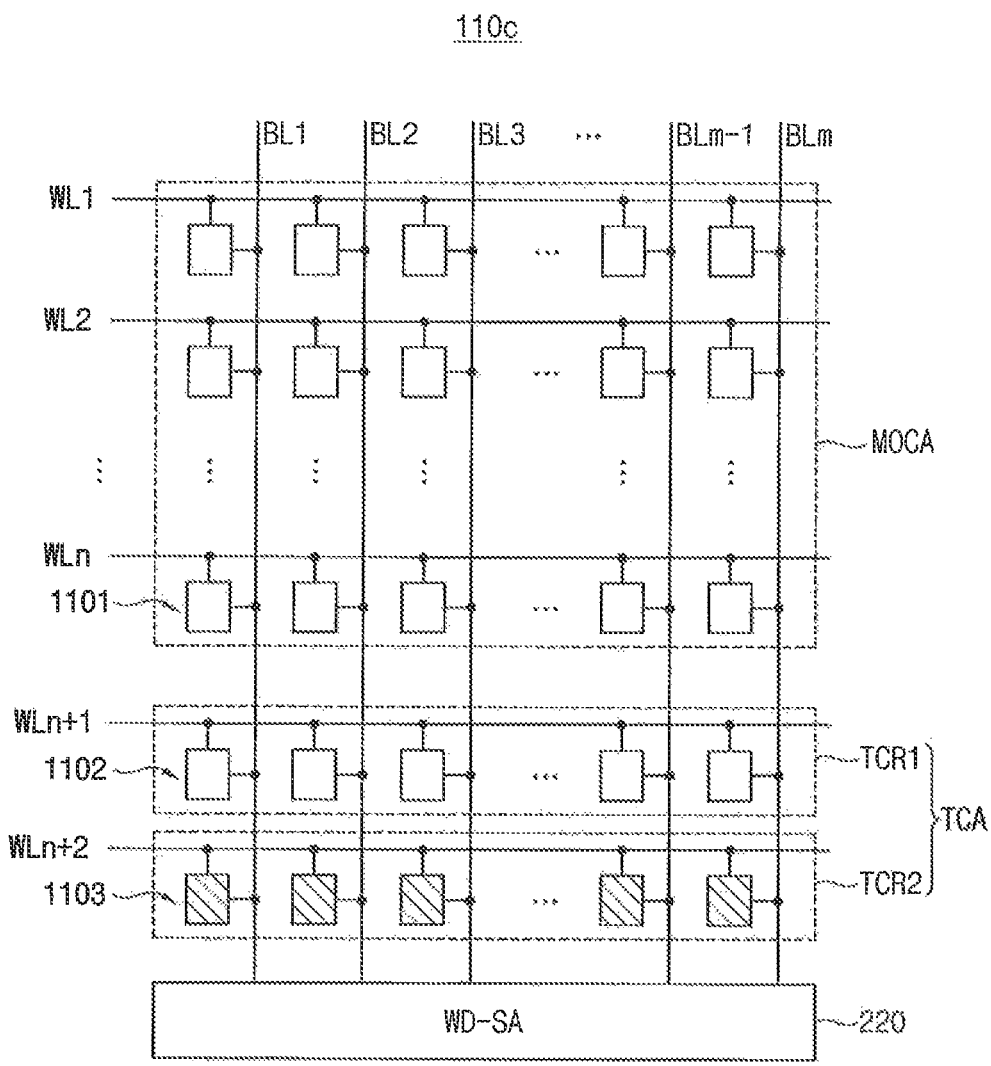
FIG. 15 illustrates an OTP cell array in the OTP memory device of FIG. 1 according to exemplary embodiments of the inventive concept.

FIG. 15 illustrates an OTP cell array in the OTP memory device 50 of FIG. 1 according to exemplary embodiments of the inventive concept.

Referring to FIG. 15, an OTP cell array 110c may include a main OTP cell array MOCA and a test cell array TCA. The main OTP cell array MOCA may include a plurality of un-programmed OTP memory cells 1101.

The test cell array TCA may include a first test row TCR1 including first un-programmed test cells 1102 and the first test row TCR1 is coupled to a word-line WLn+1. The first test cells 1102 of the first test row TCR1 may have the same structure as the OTP memory cells 1101 and may be programmed during testing of the OTP memory device 50. A program operation (or a write operation) of the OTP memory device 50 may be tested by programming the first test cells 1102 and subsequently reading data from the programmed first test cells 1102.

The test cell array TCA may include a second test row TCR2 including mask-programmed second test cells 1103 and the second test row TCR2 is coupled to a word-line WLn+2. The second test cells 1103 may be processed to correspond to the programmed state or the un-programmed state of the OTP memory cells 1101 during manufacture of the OTP memory device 50.

For example, the second test cells 1103 may have a layout having a structure corresponding to the programmed state of the OTP memory cells 1101, e.g., an anti-fuse AF type, the terminals of which have a closed state or a low-resistance state. In other words, the second test cells 1103 may have the same layout as the OTP memory cells 1101 except for the anti-fuse AF, and may include a conductor (e.g., a metal) as the structure corresponding to the anti-fuse AF of the OTP memory cells 1101.

As another example, the second test cells 1103 may have a layout having a structure corresponding to the un-programmed state of the OTP memory cells 1101, e.g., an anti-fuse AF, both ends of which have an open state or a high-resistance state. In other words, the second test cells 1103 may have the same layout as the OTP memory cells 1101 except for the anti-fuse AF, and may include an insulator as the structure corresponding to the anti-fuse AF of the OTP memory cells 1101. Thus, a read operation of the OTP memory device 50 may be tested by reading data stored in the second test cells 1103.

Figure 16:
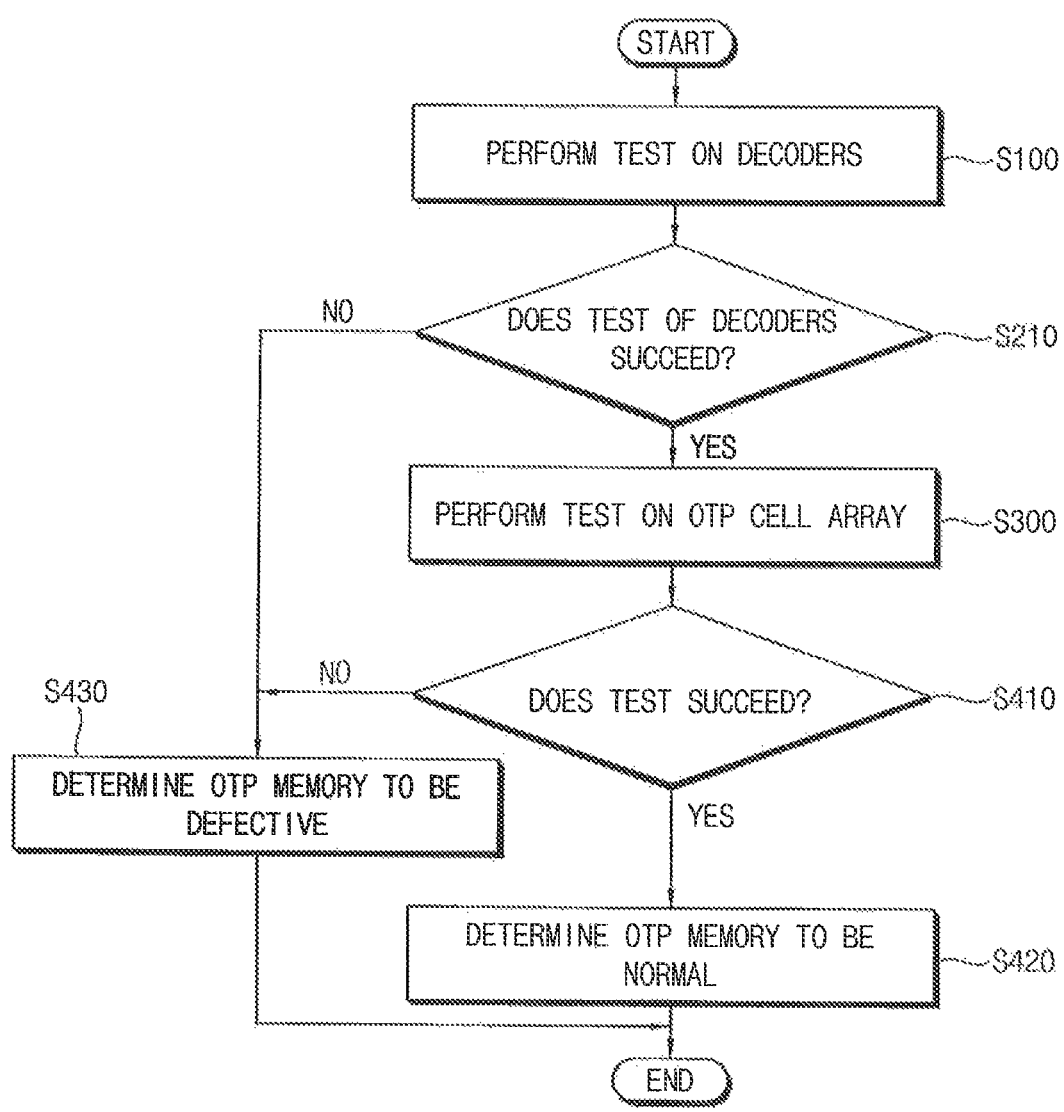
FIG. 16 is a flowchart illustrating a method of testing an OTP memory device according to exemplary embodiments of the inventive concept.

FIG. 16 is a flowchart illustrating a method of testing an OTP memory device according to exemplary embodiments of the inventive concept.

Referring to FIGS. 1 through 16, in a method of testing an OTP memory device 50 that includes an OTP cell array 110 including a plurality of OTP memory cells coupled to a plurality of bit-lines, a plurality of read word-lines and a plurality of voltage word-lines, a dummy cell block 180 coupled to the plurality of read word-lines and the plurality of voltage word-lines and an isolation circuit 160 coupled between the OTP cell array 110 and the dummy cell block 180, the isolation circuit 160 cuts off a connection between the OTP cell array 110 and the dummy cell block 180 and a first test is performed on a row decoder 230 coupled to the read word-lines and the voltage word-lines and a column decoder 210 coupled to the bit-lines, in a first test mode, in operation S100.

It is determined whether the row decoder 230 and the column decoder 210 do not have defects based on a result of the first test in operation S210. When it is determined that at least one of the row decoder 230 and the column decoder 210 has defects (NO in S210), the OTP memory device 50 is determined to be defective in operation S430.

When it is determined that the row decoder 230 and the column decoder 210 do not have defects (YES in S210), a second test is performed on the OTP cell array 110 in operation S300. It is determined whether the OTP cell array 110 does not have defects based on a result of the second test in operation S410.

When it is determined that the OTP cell array 110 does not have defects (YES in S410), the OTP memory device 50 is determined to be normal in operation S420. When it is determined that the OTP cell array 110 has defects (NO in S410), the OTP memory device 50 is determined to be defective in operation S430.

Figure 17:
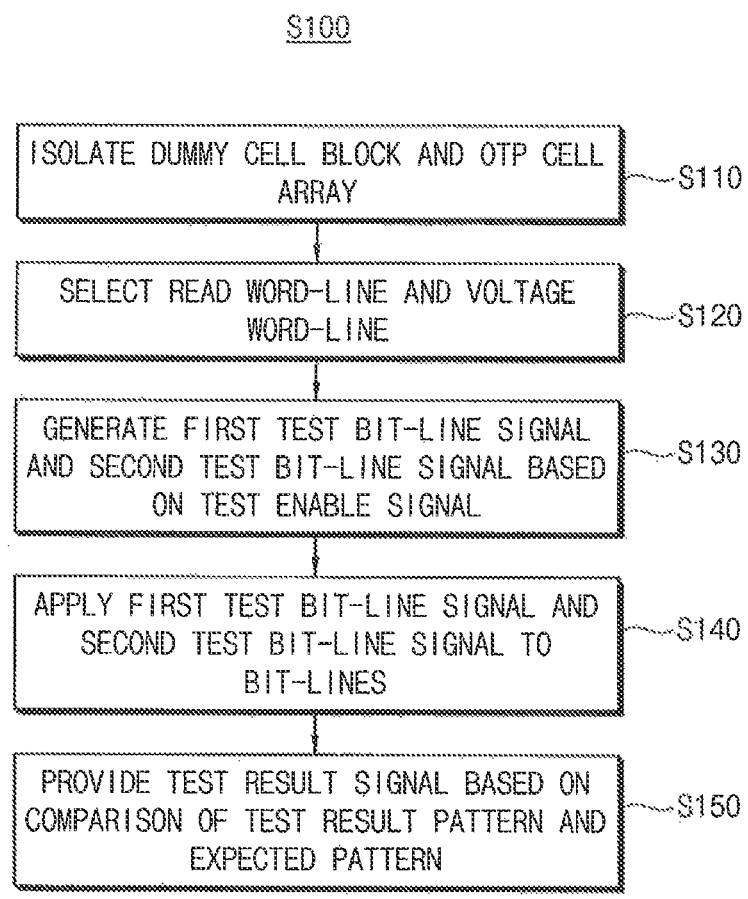
FIG. 17 illustrates an operation of testing a row decoder and a column decoder in FIG. 16.

FIG. 17 illustrates an operation of testing the row decoder and the column decoder in detail in FIG. 16.

Referring to FIGS. 1 through 14 and 17, to perform the first test on the row decoder 230 and the column decoder 210, the isolation circuit 160 cuts off the connection between the OTP cell array 110 and the dummy cell block 180 in operation S110. In other words, the dummy cell block 180 and the OTP cell array 110 are isolated from each other. The row decoder 230 selects a pair of a read word-line and a voltage word-line of the read word-lines and the voltage word-lines in response to a row address RADDR in operation S120.

A test bit-line signal generator 130 connected to the dummy cell block 180 generates a first test bit-line signal TBLS1 and a second test bit-line signal TBLS2 based on a first test enable signal TDECEN in operation S130. A switch circuit 190 coupled to the bit-lines applies the first test bit-line signal TBLS1 and the second test bit-line signal TBLS2 to the bit-lines in operation S140.

The write-sensing circuit 220 outputs a test result pattern TD received through the bit-lines. The control circuit 300 determines whether the row decoder 230 and the column decoder 210 are defective based on comparison of the test result pattern TD) output through the bit-lines and an expected pattern in order to output a test result signal TRS in operation S150.

Figure 18:
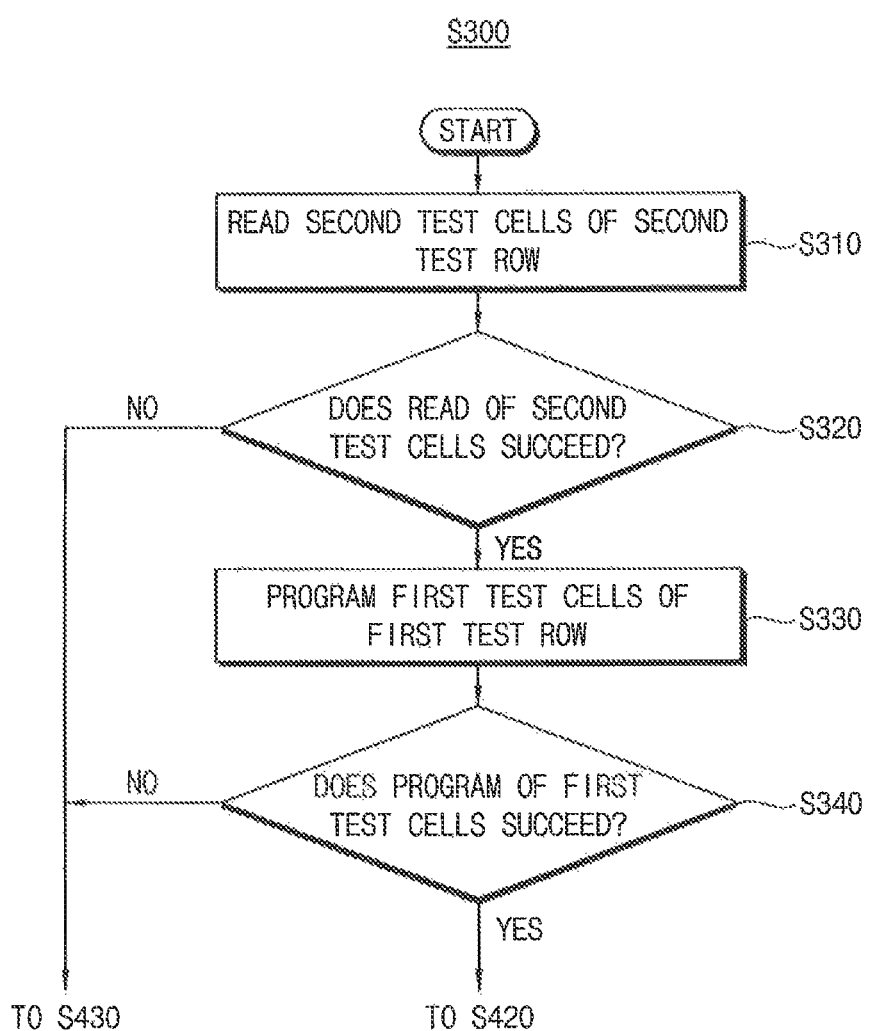
FIG. 18 illustrates an operation of testing an OTP cell array in FIG. 16.

FIG. 18 illustrates operation of testing the OTP cell array in FIG. 16.

Referring to FIGS. 1 through 15 and 18, to perform the second test in the OTP cell array 110 in operation S300, in operation S310, the states of the second test cells 1103 of the second test row TCR2 may be read. For example, the second test cells 1103 may be mask-programmed to correspond to the OTP operational memory cells programmed during manufacture of the OTP memory device 50, e.g., to store a binary value of '1'.

In operation S320, it is determined whether the reading of the second test cells 1103 of the second test row TCR2 succeeds or whether the reading fails. As described above, since the second test cells 1103 have been mask-programmed to a state known to the manufacturer of the OTP memory device 50, the determination of whether the reading operation of the second test cells 1103 of the second test row TCR2 is successful can be made based on data output from the write-sensing circuit 220 during reading of data from the mask-programmed second test cells 1103. For example, if all of the second test cells 1103 are mask-programmed to store a binary value of '1', the reading operation of the second test cells 1103 may be determined to be a failure when the data output from the write-sensing circuit 220 by accessing the second test cells 1103 includes a bit which is not a binary value of '1'.

In operation S430, if the reading operation of the second test cells 1103 fails, the OTP memory device 50 may be determined to be defective.

Alternatively, if the reading operation of the second test cells 1103 is determined to have succeeded, the process continues to operation S330. In operation S330, if the reading operation of the second test cells 1103 succeeds, the first test cells 1102 of the first test row TCR1 may be programmed. As described herein with reference to FIG. 15, the first test cells 1102 may have the same structure, e.g., the same layout, as un-programmed OTP cells 1101. During the testing of the OTP memory device 50, the first test cells 1102 may be programmed and thus the proper programming of the OTP memory device 50 may be tested in connection with operation S340.

The OTP memory device 50 thereby determined to be normal as a result of testing the OTP memory device 50 by programming the first test cells 1102 of the test cell array TCA can thus be provided to a user instead of programming at least one of the OTP memory cells 1101 in the main OTP cell array MOCA.

In operation S340, it is determined whether the programming of the first test cells 1102 succeeds or not. In other words, it is determined whether the programming of the first test cells 1102 succeeds by reviewing the data obtained by reading data stored in the first test cells 1102. For example, when all of the first test cells 1102 are programmed to store a binary value of '1' in operation S330 and the read data includes a bit which is not a '1' in operation S340, the programming of the first test cells 1102 may be determined to be a failure.

When the programming of the first test cells 1102 fails (NO in S340), the OTP memory device 50 may be determined to be defective in connection with operation S430. Alternatively, in connection with operation S420, when the programming of the first test cells 1102 succeeds, the OTP memory device 50 may be determined to be normal.

As illustrated in FIG. 18, the defective condition of an OTP memory device can be determined at an early stage by first reading the second test row TCR2 and determining whether the reading operation thereof succeeds.

Figure 19:
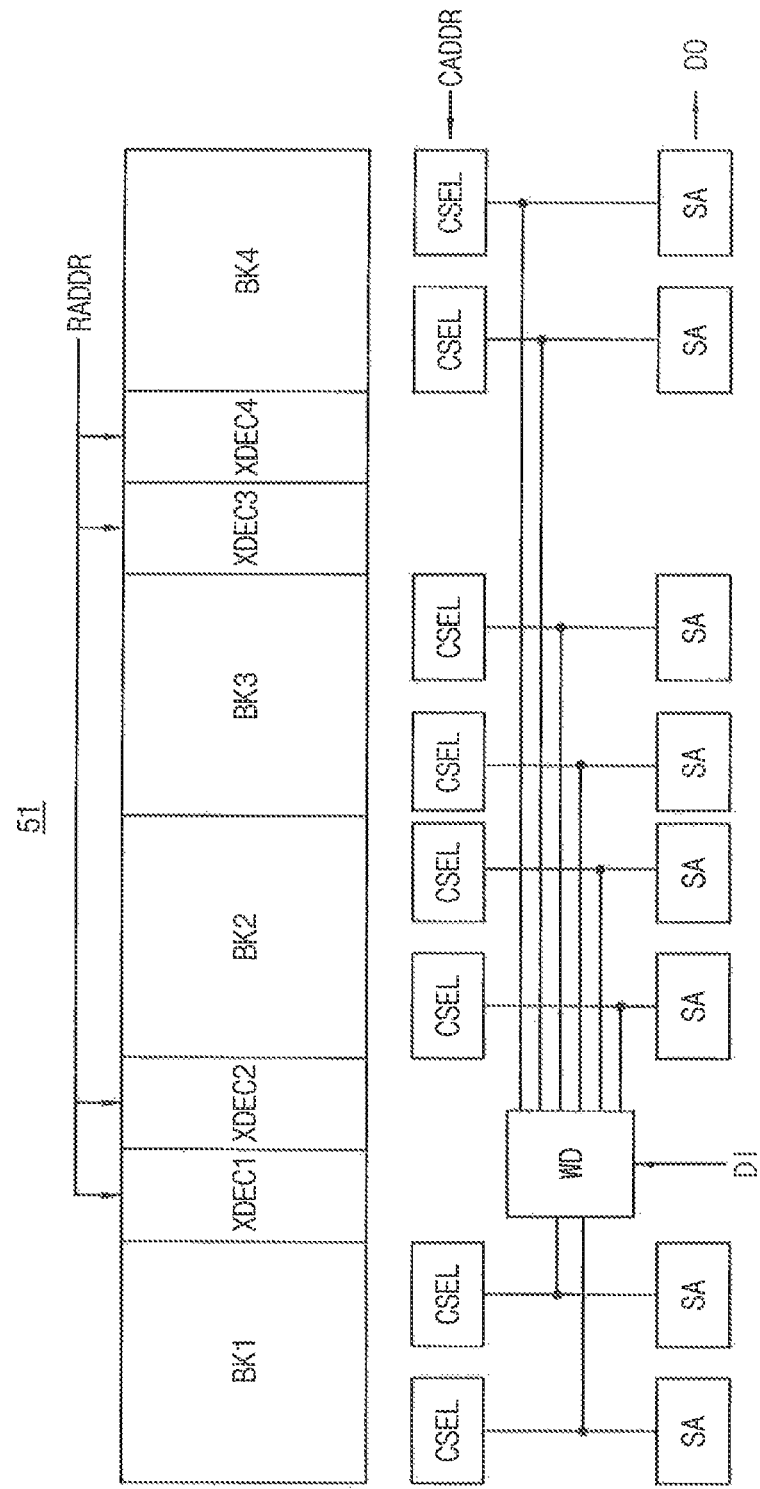
FIG. 19 is a block diagram illustrating an OTP memory device according to exemplary embodiments of the inventive concept.

FIG. 19 is a block diagram illustrating an OTP memory device according to exemplary embodiments of the inventive concept.

Referring to FIG. 19, an OTP memory device 51 may include an OTP cell array BK1, BK2, BK3 and BK4, row decoders XDEC1, XDEC2, XDEC3 and XDEC4, a voltage generator VDR, column decoders CSEL and write-sensing circuits WD and SA.

As described above, the OTP cell array BK1~BK4 may include a plurality of OTP memory cells that are coupled to a plurality of bit-lines and a plurality of word-lines, respectively. The word-lines may include voltage word-lines and read word-lines. The OTP memory cells in the OTP cell array BK1~BK4 may form a plurality of memory banks BK1~BK4.

The row decoders XDEC1~XDEC4 may select a word-line corresponding to a row address RADDR.

The column decoders CSEL may select a bit-line corresponding to a column address CADDR.

The OTP memory device 51 includes an isolation circuit and the isolation circuit may cut off the provision of a read voltage and a program voltage to the OTP cell array BK1~BK4 in a first test mode.

The OTP memory device 51 may program a plurality of bits, in other words, a plurality of OTP memory cells in the memory banks BK1~BK4 may be simultaneously programmed in the program mode. In some exemplary embodiments of the inventive concept, the OTP memory device 51 may select and enable one of the memory banks BK1~BK4 and program a plurality of OTP memory cells of a selected row in the selected memory bank simultaneously. In other exemplary embodiments of the inventive concept, the OTP memory device 51 may select and enable two or more memory banks of the memory banks BK1~BK4 and program a plurality of OTP memory cells of a selected row in the selected memory banks simultaneously.

The write driver WD may program a plurality of OTP memory cells based on program data DI including a plurality of bits, with respect to the current program address. The sense amplifier SA may generate output data DO including the plurality of bits by reading out stored values of the programmed OTP memory cells.

Figure 20:
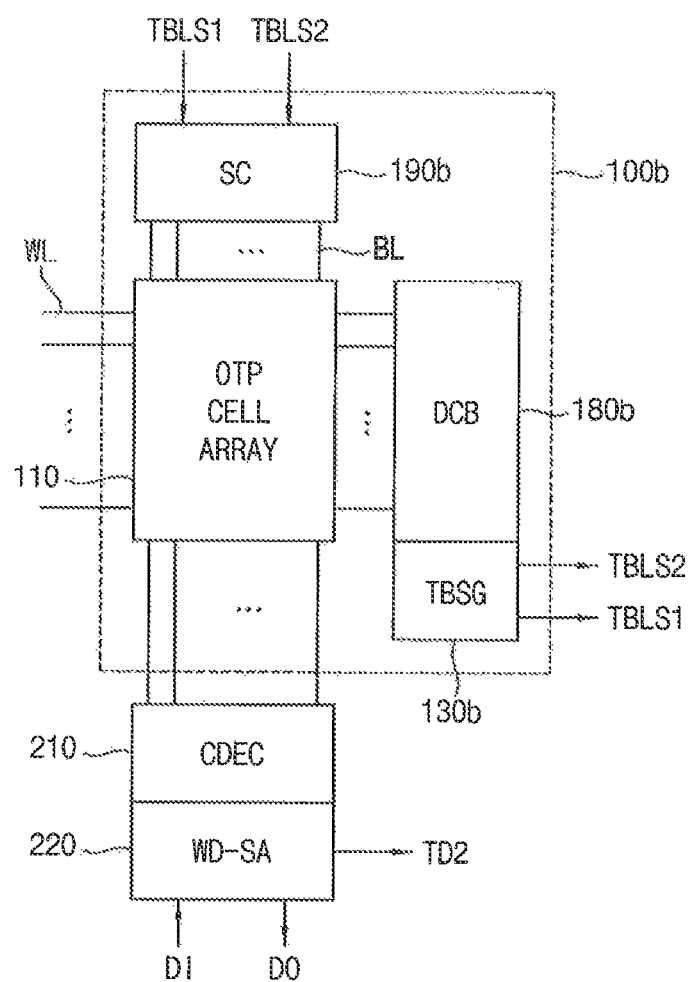
FIG. 20 is a block diagram illustrating another cell array circuit in the OTP memory device of FIG. 1 according to exemplary embodiments of the inventive concept.

FIG. 20 is a block diagram illustrating another cell array circuit in the OTP memory device 50 of FIG. 1 according to exemplary embodiments of the inventive concept.

Referring to FIG. 20, a cell array circuit 100b may include an OTP cell array 110, a dummy cell block (DCB) 180b, a test bit-line signal generator (TBSG) 130b and a switch circuit (SC) 190b. The OTP cell array 110 includes a plurality of OTP memory cells coupled to a plurality of bit-lines BL and a plurality of word-lines WL.

The OTP cell array 110 may be coupled to the row decoder 230 (in FIG. 1) through the word-lines WL and may be coupled to the column decoder (CDEC) 210 through the bit-lines BL. The column decoder 210 is coupled to the write-sensing circuit (WD-SA) 220 and the write-sensing circuit 220 writes input data DI to the OTP cell array 110 through the column decoder 210 and reads output data DO from the OTP cell array 110 through the column decoder 210 to provide the output data DO to the outside.

The dummy cell block 180b is coupled to the OTP cell array 110 through the word lines WL. The test bit-line signal generator 130b provides a first test bit-line signal TBLS1 and a second test bit-line signal TBLS2 to the switch circuit 190b in a first test mode.

The switch circuit 190b includes a plurality of switches coupled to the bit-lines BL and the plurality of switches transfer the first test bit-line signal TBLS1 and the second test bit-line signal TBLS2 to the bit-lines BL in the first test mode. Therefore, in the first test mode, the write-sensing circuit 220 may output test result pattern TD2 in response to the first test bit-line signal TBLS1 and the second test bit-line signal TBLS2 even though data is not programmed in the OTP memory cells of the OTP cell array 110.

Figure 21:
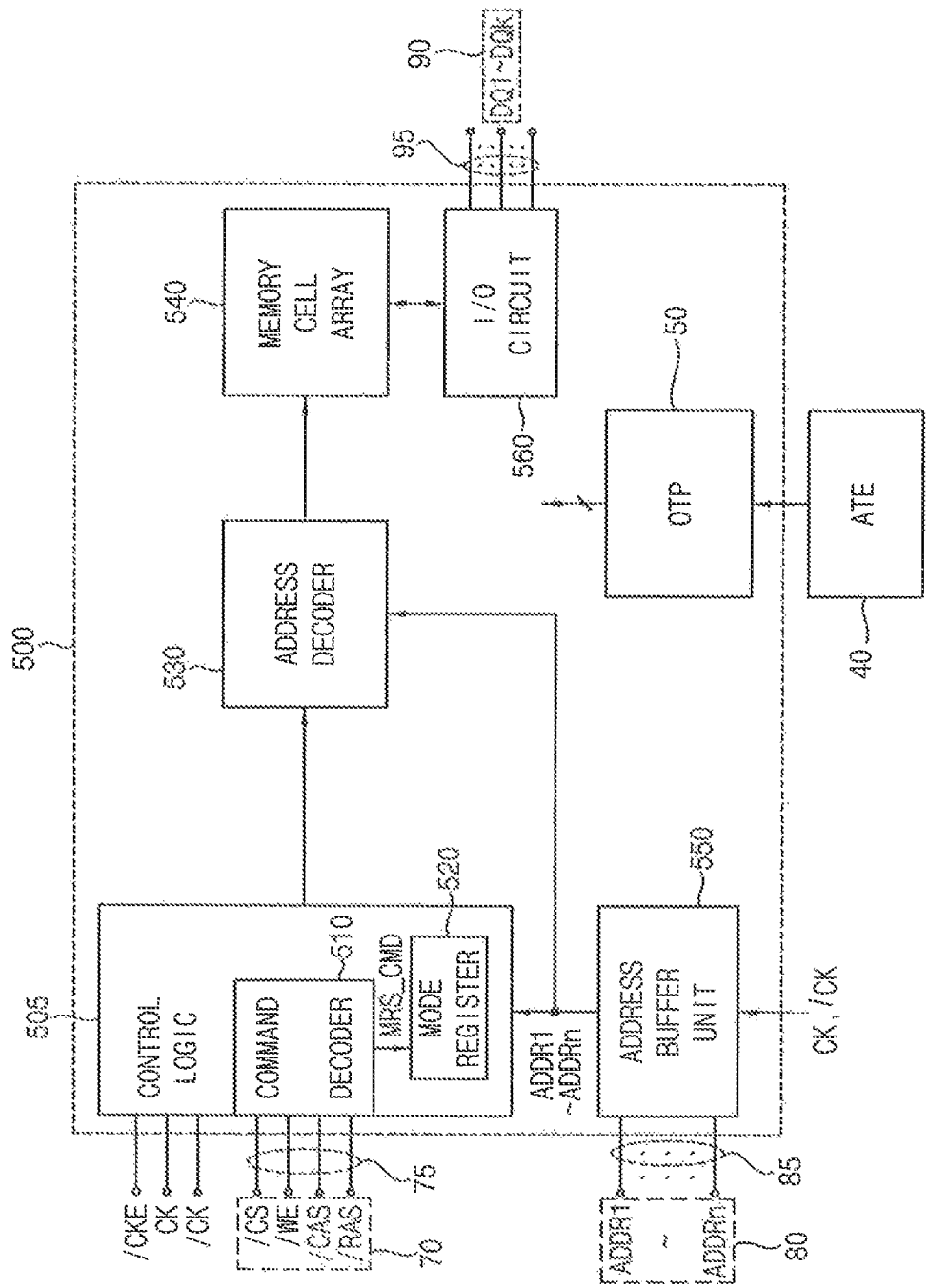
FIG. 21 is a block diagram illustrating a memory device including an OTP memory device according to exemplary embodiments of the inventive concept.

FIG. 21 is a block diagram illustrating a memory device including an OTP memory device according to exemplary embodiments of the inventive concept.

Referring to FIG. 21, a memory device 500 may include control logic 505, an address decoder 530, a memory cell array 540, an address buffer unit 550, an input/output (I/O) circuit 560 and an OTP memory device 50.

The control logic 505 receives control signals 70 through command pins 75, receives an address signal 80 through address pins 85, and controls the address decoder 530 which accesses the memory cell array 540 based on commands and the address signal 80. The control signals 70 include a chip selection signal /CS, a write enable signal /WE, a column address strobe signal /CAS, and a row address strobe signal /RAS. The address signal 30 includes addresses ADDR1~ADDRn. The combination of the control signals /CS, /WE, /CAS, and /RAS designate the command. In addition, in some embodiments of the inventive concept, the control logic 505 may also receive a clock enable signal /CKE, a clock signal CK, and an inverted clock signal /CK.

The address buffer unit 550 receives the address signal 80 through the address pins 85, and provides the addresses ADDR1~ADDRn to the control logic 505 and the address decoder 530 in synchronization with the clock signal CK or the inverted clock signal /CK.

The I/O circuit 560 provides data 90 to the memory cell array 540 or receives the data 90 from the memory cell array 540 through data pins 95. The data 90 includes data DQI-oDQk.

The control logic 505 includes a command decoder 510 and a mode register 520. The command decoder 510 decodes the command designated by the control signals /CS, /WE, /CAS, and /RAS to provide a mode register set (MRS) command MRS_CMD to the mode register 520. The mode register 520 sets an operation mode of the memory device 500 in response to the MRS command MRS_CMD. The operation mode of the memory device 500 may include a test mode, an MRS mode, a test MRS (TMRS) mode and a normal operation mode.

In the test mode, an external tester ATE 40 may program data in the OTP memory device 50. The programmed data may be used to control the memory device 500.

Figure 22:
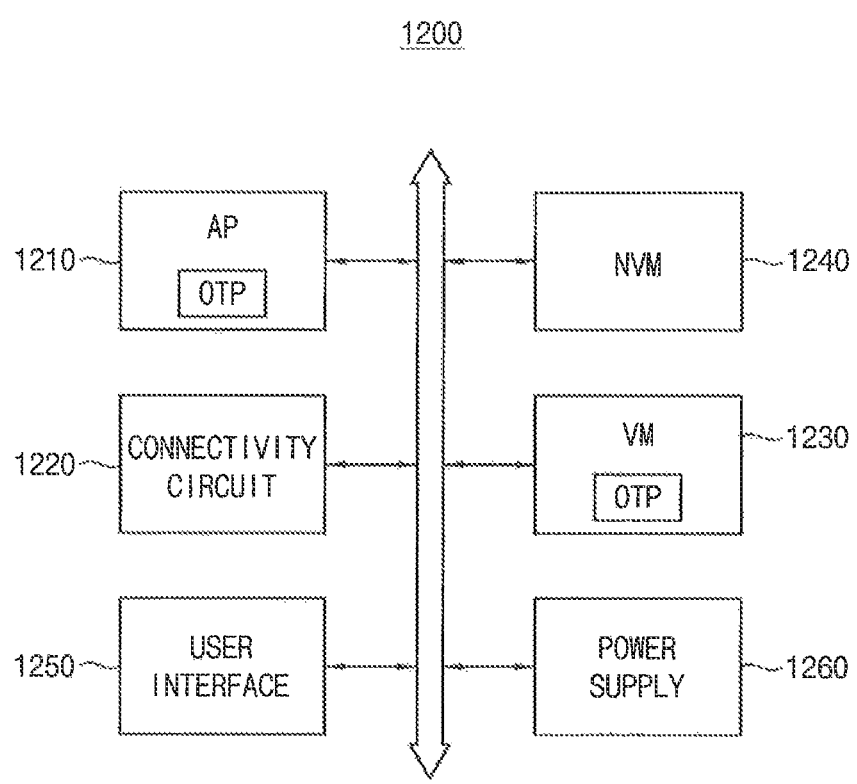
FIG. 22 is a block diagram illustrating a mobile system including an OTP memory device according to exemplary embodiments of the inventive concept.

FIG. 22 is a block diagram illustrating a mobile system including an OTP memory device according to exemplary embodiments of the inventive concept.

Referring to FIG. 22, a mobile system 1200 includes an application processor (AP) 1210, a connectivity circuit 1220, a volatile memory device (VM) 1230, a nonvolatile memory device (NVM) 1240, a user interface 1250, and a power supply 1260.

The application processor 1210 may execute applications such as a web browser, a game application, a video player, etc. The connectivity circuit 1220 may perform wired or wireless communication with an external device. The volatile memory device 1230 may store data processed by the application processor 1210, or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

In some embodiments of the inventive concept, the mobile system 1200 may further include a camera image processor (CIS), and/or a storage device, such as a memory card, a solid state drive (SSD), a hard disk drive (HDD), a compact disk read only memory (CD-ROM), etc.

The application processor 1210 and/or the volatile memory device 1230 may include an OTP memory device. As described above, the OTP memory device may include an isolation circuit and the isolation circuit may cut off a read voltage and a program voltage which are provided to an OTP cell array in a first test mode. Therefore, the OTP memory device may perform a test on a row decoder and a column decoder without being affected by states of OTP memory cells of an OTP cell array to accurately determine whether the row decoder and the column decoder have defects.

In exemplary embodiments of the inventive concept, the OTP memory device and method of testing the OTP memory device include an isolation circuit that cut offs a read voltage and a program voltage which are provided to an OTP cell array in a first test mode and thus, performs a test on a row decoder and a column decoder without being affected by states of OTP memory cells of an OTP cell array. Therefore, the OTP memory device and method of testing the OTP memory device may obtain an accurate test result for the row decoder and the column decoder.

The inventive concept as described above may be applied to apparatuses and systems using OTP memory devices for storing nonvolatile data. For example, exemplary embodiments of the inventive concept may be applied to systems such as a mobile phone, a smart phone, a personal digital assistant (PDA), a portable multimedia player (PMP), a digital camera, a camcorder, a personal computer (PC), a server computer, a workstation, a laptop computer, a digital television (TV), a set-top box, a portable game console, etc.

While the inventive concept has been shown and described with reference to exemplary embodiments thereof, it will be apparent to those of ordinary skill in the art that various modifications in form and details may be made thereto without departing from the spirit and scope of the inventive concept as set forth by the following claims.

What is claimed is:

1. A one-time programmable (OTP) memory device, comprising:
    a cell array circuit including an OTP cell array and a dummy cell block, wherein the OTP cell array includes a plurality of OTP memory cells coupled to a plurality of bit-lines, a plurality of read word-lines and a plurality of voltage word-lines and the dummy cell block is coupled to the plurality of read word-lines and the plurality of voltage word-lines;
    a row decoder coupled to the dummy cell block and the OTP cell array through the plurality of read word-lines and the plurality of voltage word-lines;
    a column decoder coupled to the OTP cell array through the plurality of bit-lines;
    a write-sensing circuit coupled to the column decoder; and
    a control circuit configured to control the cell array circuit, the row decoder and the write-sensing circuit based on a command and an address,
    wherein the cell array circuit further includes an isolation circuit configured to cut off a first voltage and a second voltage which are transferred to the OTP cell array from the row decoder, in response to control codes in a first test mode, the isolation circuit connected between the dummy cell block and the OTP cell array.

2. The OTP memory device of claim 1, wherein the isolation circuit includes a plurality of unit isolation circuits and each of the plurality of unit isolation circuits is coupled to a corresponding pair of a read word-line and a voltage word-line of the read word-lines and the voltage word-lines,
    wherein a selected unit isolation circuit of the unit isolation circuits, coupled to a selected pair of a read word-line and a voltage word-line, which is selected by the row decoder, is configured to discharge the first voltage and the second voltage to a ground in response to the control codes.

3. The OTP memory device of claim 2, wherein a first unit isolation circuit of the plurality of unit isolation circuits includes:
    a first p-channel metal-oxide semiconductor (PMOS) transistor which is coupled to the row decoder at a first node of a first read word-line of the read word-lines and is coupled to the OTP cell array at a second node of the first read word-line;
    a first n-channel metal-oxide semiconductor (NMOS) transistor coupled between the first node of the first read word-line and the second node of the first read word-line in parallel with the first PMOS transistor;
    second and third NMOS transistors coupled in series between the second node of the first read word-line and the ground;
    a second PMOS transistor which is coupled to the row decoder at a first node of a first voltage word-line of the voltage word-lines and is coupled to the OTP cell array at a second node of the first voltage word-line; and
    fourth and fifth NMOS transistors coupled in series between the second node of the first voltage word-line and the ground.

4. The OTP memory device of claim 3, wherein
    each gate of the second and fourth NMOS transistors receives a power supply voltage,
    the row decoder is configured to:
    apply a first control code to a gate of the first PMOS transistor;
    apply a second control code to a gate of the first NMOS transistor;
    apply the first control code to a gate of the third NMOS transistor;
    apply a third control code to a gate of the second PMOS transistor; and
    apply a fourth control code to a gate of the fifth NMOS transistor.

5. The OTP memory device of claim 4, wherein, in the first test mode:
    the third NMOS transistor is turned-on in response to the first control code to discharge the first voltage to the ground; and
    the fifth NMOS transistor is turned-on in response to the fourth control code to discharge the second voltage to the ground.

6. The OTP memory device of claim 1, further comprising:
    a voltage generator configured to generate a plurality of operating voltages under control of the control circuit and to provide the row decoder with at least some of the operating voltages as the first voltage and the second voltage,
    wherein the cell array circuit further includes:
    a test bit-line signal generator, coupled to the dummy cell block, and configured to generate a first test bit-line signal and a second test bit-line signal in response to a control signal in the first test mode; and
    a switch circuit configured to transfer the first test bit-line signal and the second test bit-line signal to the bit-lines in the first test mode, and
    wherein the dummy cell block includes a plurality of unit dummy cells, and at least one of the plurality of unit dummy cells is coupled to a corresponding pair of a read word-line and a voltage word-line of the read word-lines and the voltage word-lines.

7. The OTP memory device of claim 6, wherein, in the first test mode,
    the write-sensing circuit is configured to output a test result pattern to the control circuit in response to the first test bit-line signal and the second test bit-line signal, and
    the control circuit is configured to output a test result signal indicating whether the row decoder and the column decoder are defective, based on a comparison of the test result pattern and an expected pattern.

8. The OTP memory device of claim 6, wherein the plurality of unit dummy cells includes:
    a first set of unit dummy cells coupled to a first group of read word-lines and voltage word-lines of the read word-lines and the voltage word-lines, and the test bit-line signal generator; and
    a second set of unit dummy cells coupled to a second group of read word-lines and voltage word-lines of the read word-lines and the voltage word-lines, and the test bit-line signal generator,
    wherein at least one of the first set of unit dummy cells and at least one of the second set of unit dummy cells include a first transistor having a gate coupled to a corresponding read word-line and a second transistor having a gate coupled to a corresponding voltage word-line, and wherein a first terminal of the first transistor and a first terminal of the second transistor are coupled to each other.

9. The OTP memory device of claim 8, wherein the test bit-line signal generator includes:
a first inverter that includes an input for receiving a program control signal and an output coupled to a second terminal of the second transistor of the at least one of the first set of unit dummy cells and a second terminal of the second transistor of the at least one of the second set of unit dummy cells;
a second inverter that includes an input for receiving a first test enable signal and an output coupled to a first node;
a third inverter that includes an input coupled to the first node and an output coupled to a second terminal of the first transistor of the at least one of the first set of unit dummy cells at a second node;
a fourth inverter that includes an input coupled to the second node and an output for providing the first test bit-line signal;
a fifth inverter that includes an input coupled to the first node and an output coupled to a second terminal of the first transistor of the at least one of the second set of unit dummy cells at a third node; and
a sixth inverter that includes an input coupled to the third node and an output for providing the second test bit-line signal.

10. The OTP memory device of claim 9, wherein if a first pair of a read word-line and a voltage word-line is selected among the first group of read word-lines and voltage word-lines, a first current path is formed from the second node to the first inverter through a first unit dummy cell, coupled to the first pair, included in the first set, and
wherein if a second pair of a read word-line and a voltage word-line is selected among the second group of read word-lines and voltage word-lines, a second current path is formed from the third node to the first inverter through a second unit dummy cell, coupled to the second pair, included in the second set.

11. The OTP memory device of claim 6, wherein the switch circuit includes a plurality of switches configured to transfer the first test bit-line signal and the second test bit-line signal to the bit-lines in response to a first test enable signal, and
wherein the bit-lines includes a first group of bit-lines and a second group of bit-lines, the first group of bit-lines correspond to odd bit-lines of the bit-lines and the second group of bit-lines correspond to even bit-lines of the bit-lines.

12. The OTP memory device of claim 11, wherein the plurality of switches are configured to transfer the first test bit-line signal to the first group of bit-lines and to transfer the second test bit-line signal to the second group of bit-lines.

13. The OTP memory device of claim 11, wherein the plurality of switches are configured to transfer the first test bit-line signal to the second group of bit-lines and to transfer the second test bit-line signal to the first group of bit-lines.

14. The OTP memory device of claim 1, wherein the row decoder includes a control code generator,
wherein the control code generator is configured to generate a plurality of control codes to be provided to the isolation circuit, based to a row address and a first test enable signal in the first test mode, and
wherein the row address designates a corresponding pair of a read word-line and a voltage word-line of the read word-lines and the voltage word-lines.

15. The OTP memory device of claim 1, wherein the cell array circuit further includes:
a test cell array that includes a first test row having un-programmed first test cells and a second test row including mask-programmed second test cells, wherein the test cell array shares bit-lines with the OTP cell array,
wherein the first test cells and second test cells are accessible during testing of the OTP cell array.

16. The OTP memory device of claim 15, wherein the first test cells have a same structure as the OTP memory cells,
wherein the second test cells are mask-programmed to a state corresponding to programmed OTP memory cells,
wherein if the control circuit determines that the row decoder and the column decoder are not defective in the first test mode, the control circuit is configured to perform a second test on the OTP cell array by performing a read operation on the first cells and by performing a program operation on the second test cells in a second test mode.

17. A method of testing a one-time programmable (OTP) memory device, wherein the OTP memory device includes an OTP cell array including a plurality of OTP memory cells coupled to a plurality of bit-lines, a plurality of read word-lines and a plurality of voltage word-lines, a dummy cell block coupled to the plurality of read word-lines and the plurality of voltage word-lines and an isolation circuit coupled between the OTP cell array and the dummy cell block, the method comprising:
performing a first test on a row decoder and a column decoder after cutting-off, by the isolation circuit, a connection of the dummy cell block and the OTP cell array in a first test mode, the row decoder being coupled to the plurality of read word-lines and the plurality of voltage word-lines and the column decoder being coupled to the plurality of bit-lines;
performing a second test on the OTP cell array in a second test mode if the row decoder and the column decoder are determined not to be defective in the first test; and
determining whether the OTP memory device is defective based on a result of the second test.

18. The method of claim 17, wherein performing the first test includes:
selecting a pair of a read word-line and a voltage word-line of the read word-lines and the voltage word-lines;
generating, by a test bit-line signal generator coupled to the dummy cell block, a first test bit-line signal and a second test bit-line signal in response to a first test enable signal;
applying the first test bit-line signal and the second test bit-line signal to the bit-lines; and
determining whether the row decoder and the column decoder are defective based on a comparison of a test result pattern output through the bit-lines and an expected pattern.

19. A one-time programmable (OTP) memory device, comprising:
a cell array circuit including an OTP cell array, an isolation circuit and a dummy cell block, wherein the OTP cell array includes a plurality of OTP memory cells coupled to a plurality of bit-lines, a plurality of first word-lines and a plurality of second word-lines;

a row decoder coupled to the dummy cell block through the plurality of first word-lines and the plurality of second word-lines;
a column decoder coupled to the OTP cell array through the plurality of bit-lines; and
a control circuit configured to control the cell array circuit and the row decoder,
wherein the row decoder is configured to provide the isolation circuit with control codes instructing the isolation circuit to cut off a first voltage and a second voltage in a test mode, and wherein the isolation circuit is connected between the OTP cell array and the dummy cell block.

* * * * *